(12) United States Patent
Liu et al.

(10) Patent No.: US 11,380,782 B2
(45) Date of Patent: Jul. 5, 2022

(54) VARIABLE SIZE FIN STRUCTURES

(71) Applicant: Taiwan Semiconductor Manufacturing Co., Ltd., Hsinchu (TW)

(72) Inventors: Su-Hao Liu, Jhongpu Township (TW); Huicheng Chang, Tainan (TW); Chien-Tai Chan, Hsinchu (TW); Liang-Yin Chen, Hsinchu (TW); Yee-Chia Yeo, Hsinchu (TW); Szu-Ying Chen, Jhongpu Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/996,665

(22) Filed: Aug. 18, 2020

(65) Prior Publication Data
US 2022/0059679 A1    Feb. 24, 2022

(51) Int. Cl.
*H01L 29/66* (2006.01)
*H01L 21/8234* (2006.01)
*H01L 29/78* (2006.01)

(52) U.S. Cl.
CPC ............... *H01L 29/66818* (2013.01); *H01L 21/823431* (2013.01); *H01L 29/785* (2013.01)

(58) Field of Classification Search
CPC ....... H01L 29/66818; H01L 21/823431; H01L 21/845; H01L 21/823821; H01L 27/1211; H01L 27/0886; H01L 27/0924; H01L 27/10879; H01L 29/41791; H01L 29/66795–66818; H01L 29/785–7856; H01L 2924/13067
See application file for complete search history.

(56) References Cited

U.S. PATENT DOCUMENTS

2016/0379982 A1* 12/2016 You ...................... H01L 29/0657
                                                            257/369
2017/0200810 A1*  7/2017 Mao ....................... H01L 29/785

* cited by examiner

*Primary Examiner* — Cuong B Nguyen
(74) *Attorney, Agent, or Firm* — Sterne, Kessler, Goldstein & Fox P.L.L.C.

(57) ABSTRACT

The present disclosure describes a semiconductor structure and a method for forming the same. The semiconductor structure can include a substrate, a first fin structure with a first height and a first width formed over the substrate, a second fin structure with a second height and a second width formed over the substrate, and an insulating stack formed over lower portions of the first and second fin structures. The second height can be substantially equal to the first height and the second width can be greater than the first width. A top surface of the insulating stack can be below top surfaces of the first and second fin structures.

20 Claims, 13 Drawing Sheets

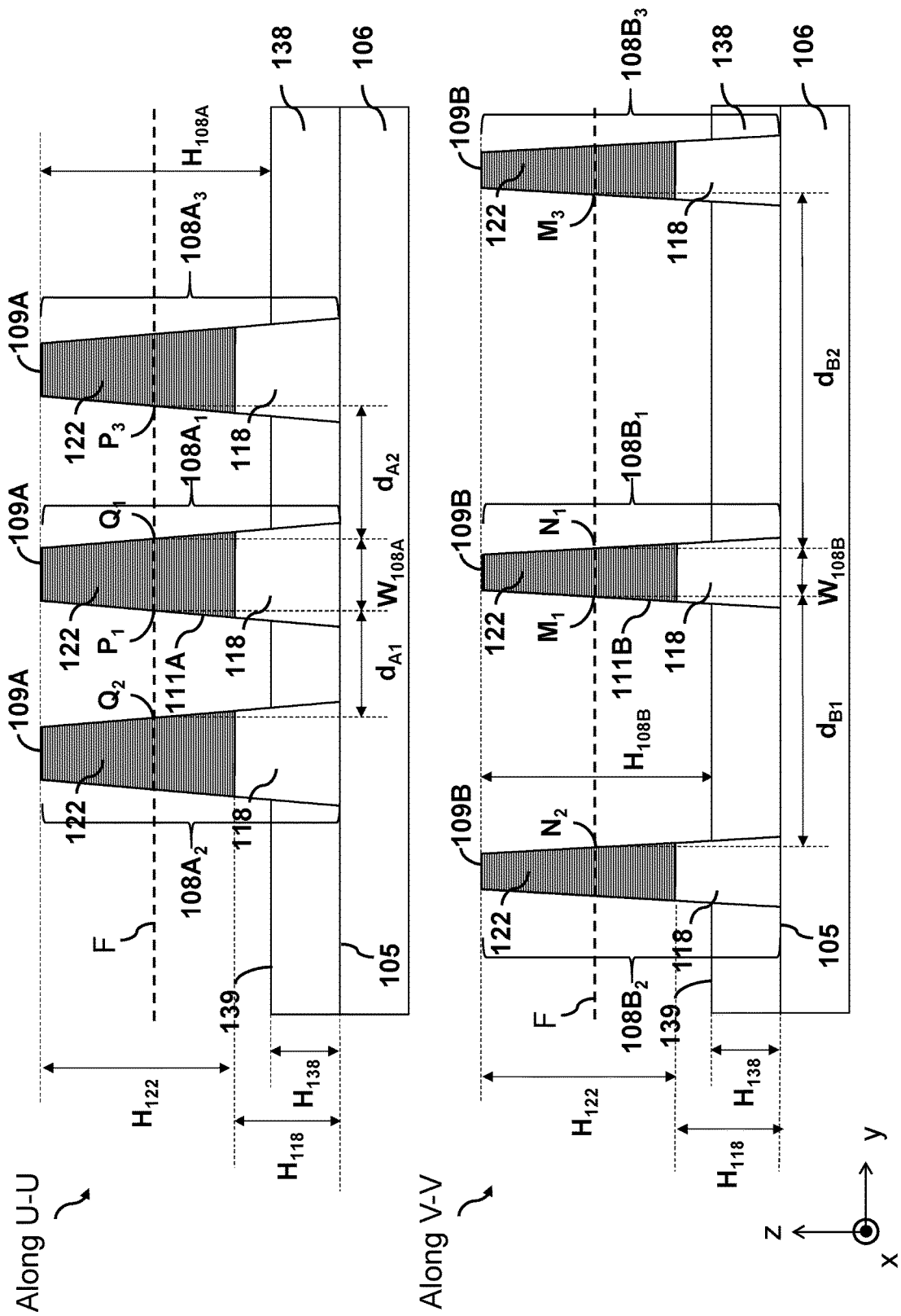

VARIABLE SIZE FIN STRUCTURES

BACKGROUND

Fin field effect transistors (finFETs) can have fin structures for improved gate control over their channel regions. The size of the fin structures can vary in different areas of an integrated circuit (IC). Such fin size variation can degrade IC performance.

BRIEF DESCRIPTION OF THE DRAWINGS

Aspects of this disclosure are best understood from the following detailed description when read with the accompanying figures.

FIGS. 1C-1E illustrate cross-sectional views of a semiconductor device, according to some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
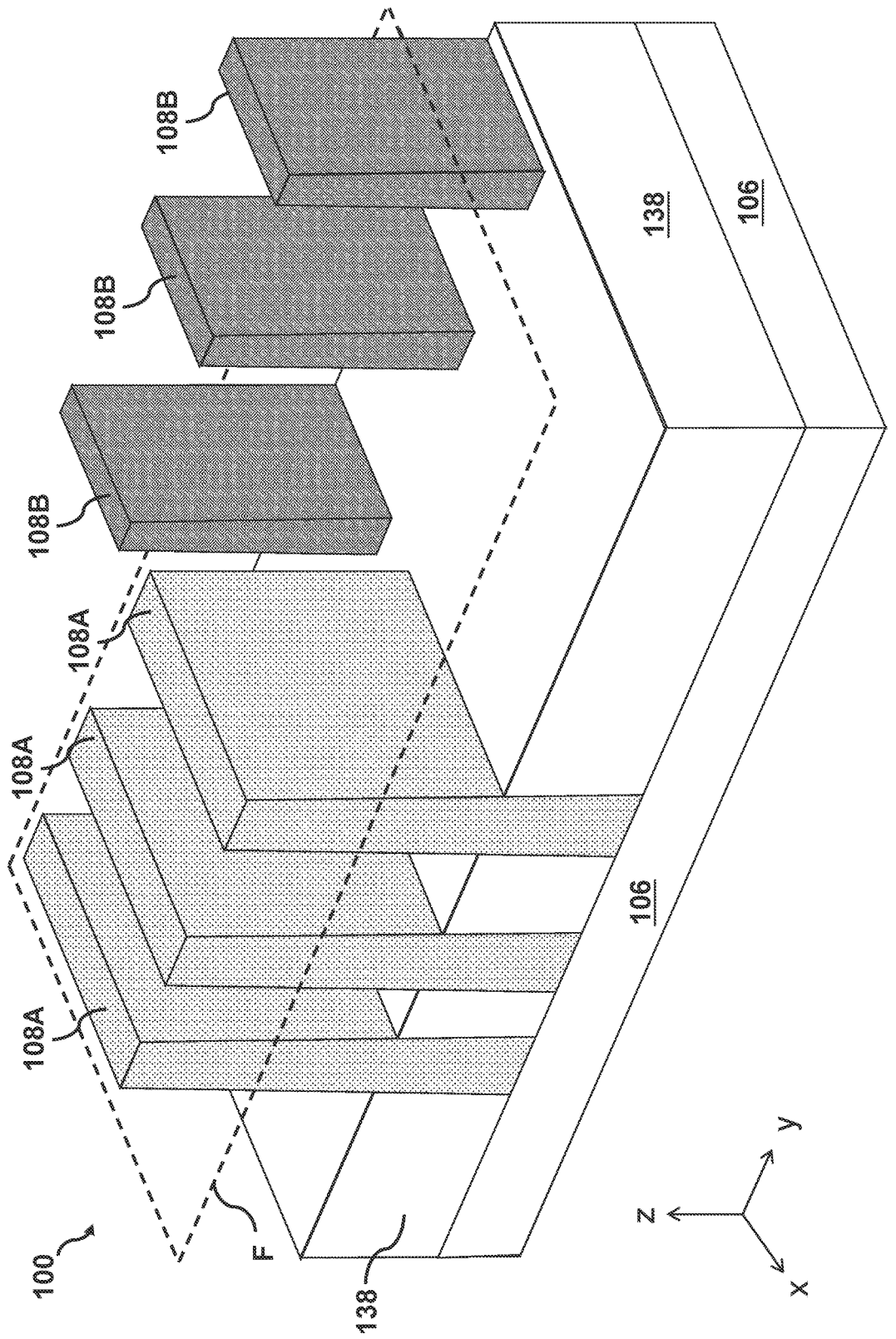
FIG. 1A illustrates an isometric view of a semiconductor device, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

As used herein, the term "vertical" means nominally perpendicular to the surface of a substrate.

As used herein, the term "insulating layer" refers to a layer that functions as an electrical insulator (e.g., a dielectric layer).

As used herein, the term "high-k" refers to a dielectric constant that is greater than the dielectric constant of $SiO_2$ (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

Fins associated with fin field effect transistors (finFETs) or gate-all-around (GAA) FETs may be patterned by any suitable method. For example, the fins may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Fins can be used in finFETs or GAA FETs to provide improved gate control over their channel regions and alleviate short-channel effects. The fins can have width variations at different areas of an integrated circuit (IC). The area dependent fin width variations can degrade the FETs' channel control and/or introduce transistor mismatches in the IC. Although fabrication processes (e.g., lithography) can be applied to universally decrease the widths of all fins to address short channel effects or transistor mismatches, such fabrication processes can cause bending or collapsing of some of the fins that are originally designed with narrow widths, thus reducing an overall yield of the IC.

To address the aforementioned challenges, this disclosure is directed to a method to provide variable fin width trimming (e.g., etching) at different areas of the IC. In some embodiments, the method can include thinning a first group of fins' width by a first amount and thinning a second group of fins' width by a second amount. In some embodiments, the first amount can be greater than the second amount, in which the first group of fins can have lower fin density than the second group of fins. In some embodiments, silicon and silicon-germanium (SiGe) fins can be fabricated using the methods described herein. A benefit of the present disclosure, among others, is to selectively provide a greater width reduction for fins located at a sparse pitch area of the IC while preserving a structure integrity for the other fins located at a tight pitch area of the IC, thus enhancing the short channel control and fin structure integrity for the transistors in the IC.

Figure 1B:
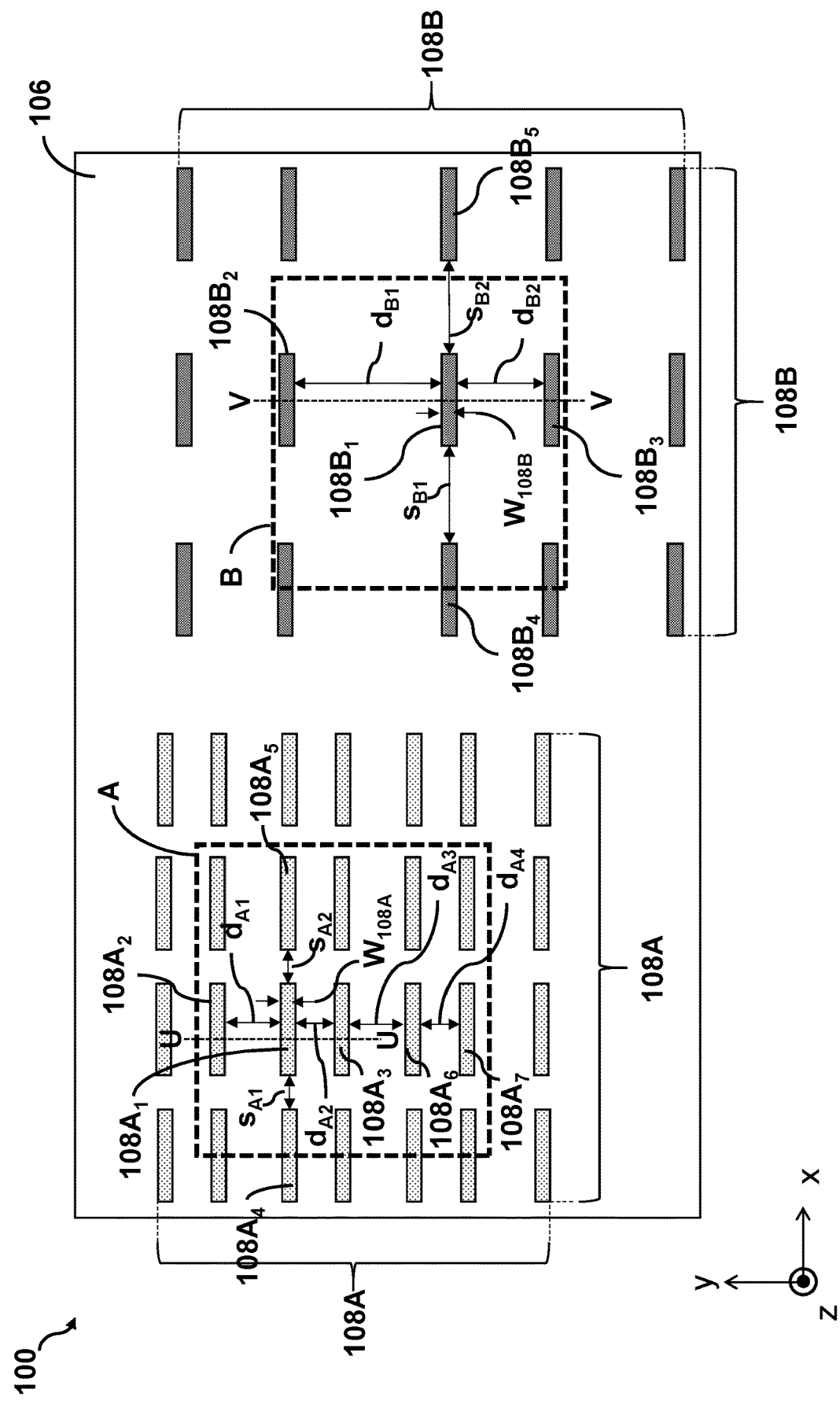
FIG. 1B illustrates a top view of a semiconductor device, according to some embodiments.
Figure 1D:
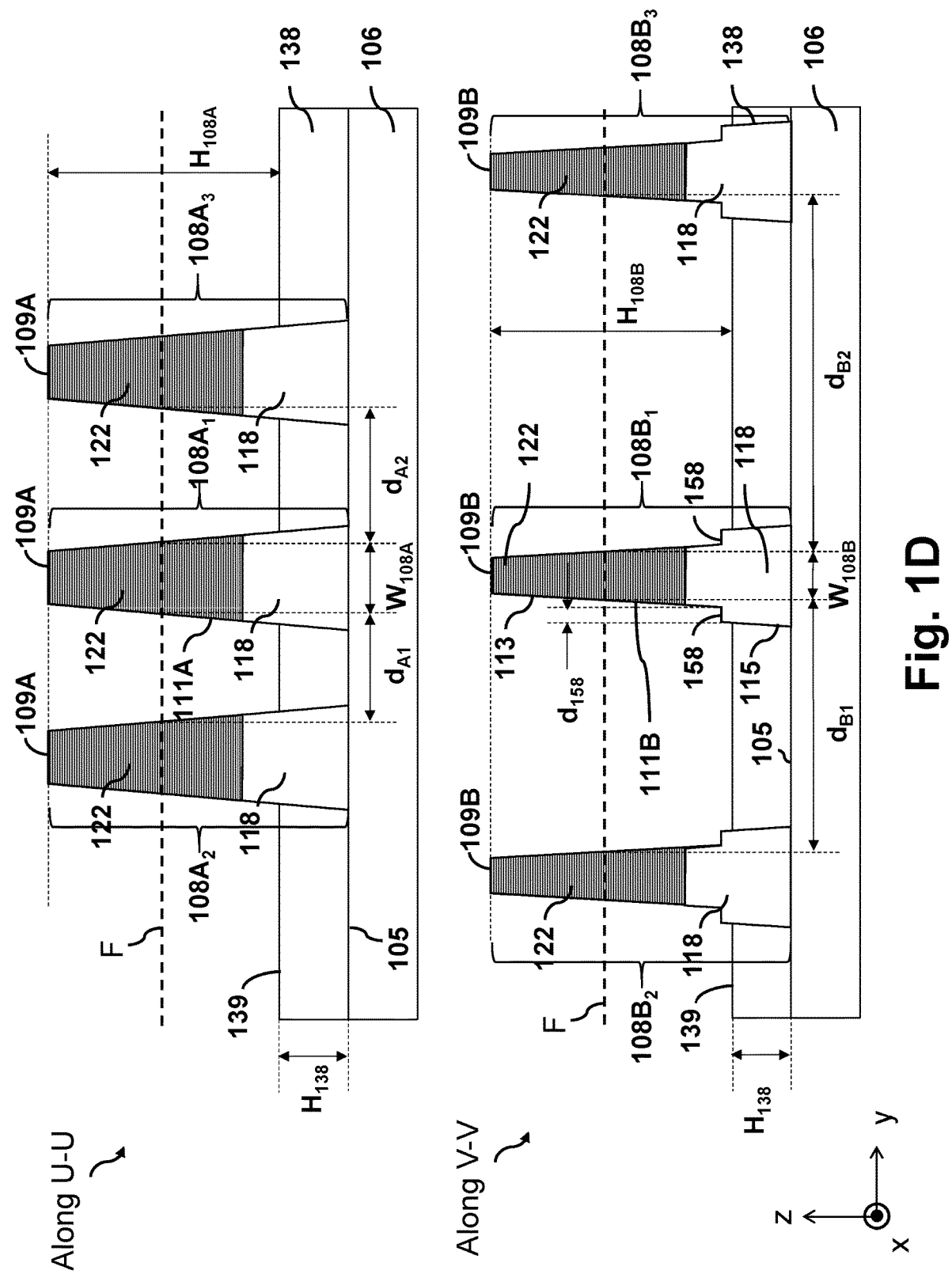
Figure 1E:
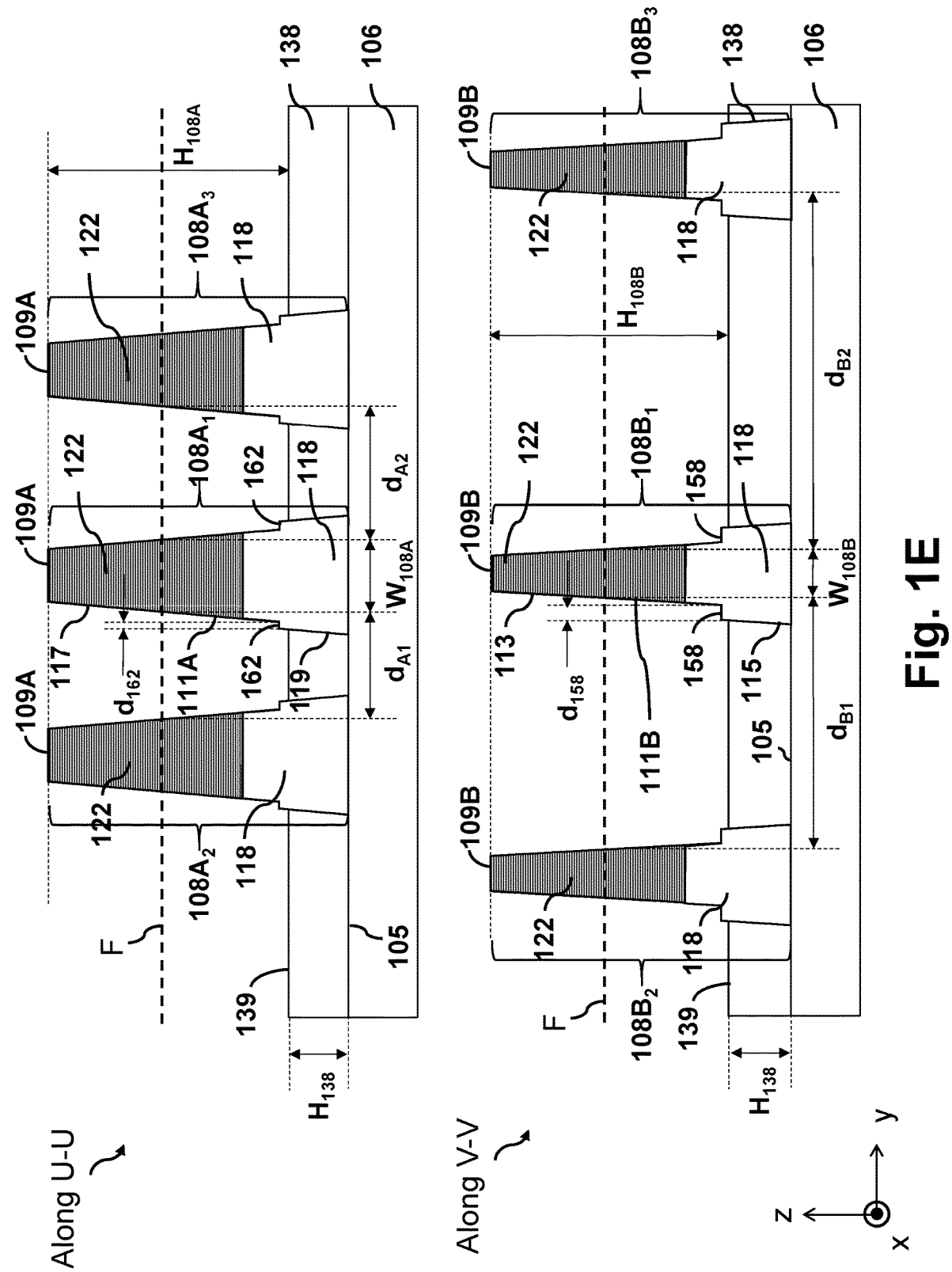

A semiconductor device 100 having fin structures 108 formed over various areas of a substrate 106 is described with reference to FIGS. 1A-1E, according to some embodiments. For example, semiconductor device 100 can have fin structures 108A and fin structures 108B respectively formed over substrate 106's areas A and B. FIG. 1A illustrates an isometric view of semiconductor device 100, according to some embodiments. FIG. 1B illustrates a top view of semiconductor device 100, according to some embodiments. Each of FIGS. 1C-1E illustrates cross-sectional views along lines U-U and V-V of semiconductor device 100, according to some embodiments. Semiconductor device 100 can be included in a microprocessor, memory device, or other integrated circuit (IC). The number of fin structures 108A and 108B illustrated in FIGS. 1A-1E are illustrative and are not limiting. Further, the discussion of elements in FIGS. 1A-1E with the same annotations applies to each other, unless mentioned otherwise.

Referring to FIGS. 1A and 1B, each of fin structures 108A (e.g., fin structures $108A_1$-$108A_7$) can extend along an x-axis with a width $W_{108A}$ traversed along an y-axis. Similarly, each of fin structures 108B (e.g., fin structures $108B_1$-$108B_5$) can extend along the x-axis with a width $W_{108B}$ traversed along the y-axis. Each of fin structures 108A can be proximate to one another in substrate 106's area A. Similarly, each of fin structures 108B can be proximate to one another in substrate 106's area B. Areas A and B can be two different enclosed areas non-overlapped with each other. In some embodiments, area A can be referred as a tight-pitch area, and area B can be referred as a sparse-pitch area. Accordingly, a separation in a lateral direction (e.g., in the y-direction) between two proximate fin structures 108A in area A can be less than a separation in the lateral direction (e.g., in the y-direction) between two proximate fin structures 108B in area B. For example, in area A, fin structure $108A_1$ (e.g., one of fin structures 108A) can be proximate to and separated from fin structures $108A_2$ and $108A_3$ by a separation $d_{A1}$ and a separation $d_{A2}$, respectively, along the y-direction. Similarly, in area B, fin structure $108B_1$ (e.g., one of fin structures 108B) can be proximate to and separated from fin structures $108B_2$ and $108B_3$ by a separation $d_{B1}$ and a separation $d_{B2}$, respectively, along the y-direction. Separation $d_{A1}$ can be less than separation $d_{B1}$ and/or separation $d_{B2}$. Separation $d_{A2}$ can be less than separation $d_{B1}$ and/or separation $d_{B2}$. In some embodiments, an average of separations $d_{A1}$ and $d_{A2}$ can be less than an average of separations $d_{B1}$ and $d_{B2}$. In some embodiments, a median of separations $d_{A1}$ and $d_{A2}$ can be less than a median of separations $d_{B1}$ and $d_{B2}$. In some embodiments, separation $d_{A1}$ can be from about 15 nm to about 40 nm, and separation $d_{A2}$ can be from about 40 nm to about 100 nm. In some embodiments, separation $d_{B1}$ can be from about 40 nm to about 200 nm, and separation $d_{B2}$ can be from about 100 nm to about 300 nm. In some embodiments, the number of fin structures 108A within area A can be greater than the number of fin structures 108B in area B, where areas A and B can have a substantially equal area size.

In some embodiments, in area A, fin structure $108A_1$ can be proximate to and separated from fin structures $108A_4$ and $108A_5$ by separations $S_{A1}$ and $S_{A2}$, respectively, along the x-direction. Similarly, in area B, fin structure $108B_1$ can be proximate to and separated from fin structures $108B_4$ and $108B_5$ by separations $S_{B1}$ and $S_{B2}$, respectively, along the x-direction. Separation Sal can be less than separation $S_{B1}$ and/or separation $S_{B2}$. Separation $S_{A2}$ can be less than separation $S_{B1}$ and/or separation $S_{B2}$. In some embodiments, an average of separations $S_{A1}$ and $S_{A2}$ can be less than an average of separations $S_{B1}$ and $S_{B2}$. In some embodiments, a median of separations Sal and $S_{A2}$ can be less than a median of separations $S_{B1}$ and $S_{B2}$.

In some embodiments, each of fin structures 108A can be proximate to one another in area A, and each of fin structures 108B can be proximate to one another in area B, where an average lateral (e.g., in the y-direction) separation between fin structures 108A can be less than an average lateral (e.g., in the y-direction) separation between fin structures 108B. For example, referring to FIG. 1B, fin structures $108A_1$, $108A_2$, $108A_3$, $108A_6$, and $108A_7$ can be proximate to one another in the y-direction with separations of $d_{A1}$, $d_{A2}$, $d_{A3}$, and $d_{A4}$. Fin structure $108B_1$, $108B_2$, and $108B_3$ can be proximate to one another in the y-direction with separations $d_{B1}$ and $d_{B2}$, as previously discussed. Accordingly, an average of separations $d_{A1}$, $d_{A2}$, $d_{A3}$, and $d_{A4}$ (e.g., the average of lateral separation between fin structures 108A) can be less than an average of separations $d_{B1}$ and $d_{B2}$ (e.g., the average of lateral separation between fin structures 108B). In some embodiments, the average of lateral (e.g., in the y-direction) separation between each of two proximate fin structures 108A can be from about 25 nm to about 70 nm, and the average of lateral (e.g., in the y-direction) separation between each of two proximate fin structures 108B can be from about 70 nm to about 250 nm. In some embodiments, a ratio of the average of lateral (e.g., in the y-direction) separation between each of two proximate fin structures 108B to the average of lateral (e.g., in the y-direction) separation between each of two proximate fin structures 108A can be from about 1 to about 15, because area A can be designated to a portion of an integrated circuit, such as a logic circuit, that has a tight-pitch density requirement, and area B can be designated to another portion of the integrated circuit, such as an analog circuit, that has a low transistor mismatch requirement. If the above-noted ratio is below the above-noted lower limit, the performance of analog circuit in area B can degrade. If the above-noted ratio is beyond the above-noted upper limit, the analog circuit in area B may occupy a large chip area that can violate the technology node's requirement associated with semiconductor device 100.

In some embodiments, fin structures 108A can be proximate to one another in area A, and fin structures 108B can be proximate to one another in area B, where a median of separations in a lateral direction (e.g., in the y-direction) between fin structures 108A can be less than a median of separations in the lateral direction (e.g., in the y-direction) between fin structures 108B. For example, referring to FIG. 1B, fin structures $108A_1$, $108A_2$, $108A_3$, $108A_6$, and $108A_7$ can be proximate to one another in the y-direction with separation of $d_{A1}$, $d_{A2}$, $d_{A3}$, and $d_{A4}$. Fin structure $108B_1$, $108B_2$, and $108B_3$ can be proximate to one another in the y-direction with s separation $d_{B1}$ and $d_{B2}$, as previously discussed. Accordingly, a median of separation $d_{A1}$, $d_{A2}$, $d_{A3}$, and $d_{A4}$ (e.g., the median of lateral separation between fin structures 108A) can be less than a median of separation $d_{B1}$ and $d_{B2}$ (e.g., the median of lateral separation between fin structures 108B). In some embodiments, the median of lateral (e.g., in the y-direction) separation between each of two proximate fin structures 108A can be from about 25 nm to about 70 nm, and the median of lateral (e.g., in the y-direction) separation between each of two proximate fin structures 108B can be from about 70 nm to about 250 nm. In some embodiments, a ratio of the median of lateral (e.g., in the y-direction) separation between each of two proximate fin structures 108B to the median of lateral (e.g., in the y-direction) separation between each of two proximate fin structures 108A can be from about 1 to about 15. If the above-noted ratio is below the above-noted lower limit, the performance of analog circuit in area B can degrade. If the above-noted ratio is beyond the above-noted upper limit, the analog circuit in area B may occupy a large chip area that can violate the technology node's requirement associated with semiconductor device 100.

Referring to FIGS. 1A and 1C, each fin structure 108A and fin structure 108B can be formed through shallow trench isolation (STI) region 138 to contact substrate 106. Each fin structure 108A can have a top surface 109A and two opposite side surfaces 111A connecting top surface 109A and substrate 106. Similarly, each fin structure 108B can have a top surface 109B and two opposite side surfaces 111B connecting top surface 109B and substrate 106. In some embodiments, top surfaces 109A and 109B can be substantially coplanar with each other. In some embodiments, side surfaces 111A and 111B can be substantially straight sidewalls that are substantially perpendicular to substrate 106's top surface 105. In some embodiments, side surfaces 111A and 111B can be slanting sidewalls with respect to substrate 106's top surface 105.

Each fin structure 108A and fin structure 108B can respectively have a width $W_{108A}$ and a width $W_{108B}$ traversed along the y-direction. For example, as shown in FIGS. 1A and 1C, a cross-sectional plane F substantially parallel to substrate 106 can cross cross-sectional line U-U to intersect points $P_1$ and $Q_1$ on fin structure $108A_1$'s opposite side surfaces 111A, where fin structure $108A_1$'s width $W_{108A}$ can be a lateral separation between points $P_1$ and $Q_1$. Cross-sectional plane F can also cross cross-sectional line U-U to intersect points $Q_2$ and $P_3$ on fin structure $108A_2$'s side surface and fin structure $108A_3$'s side surface that are proximate to fin structure $108A_1$. Separation $d_{A1}$ between fin structure $108A_1$ and fin structure $108A_2$ can be a lateral separation between points $P_1$ and $Q_2$. Separation $d_{A2}$ between fin structure $108A_1$ and fin structure $108A_3$ can be a lateral separation between points $P_3$ and $Q_1$. Plane F can further cross cross-sectional line V-V to intersect points $M_1$ and $N_1$ on fin structure $108B_1$'s opposite side surfaces 111B, where fin structure $108B_1$'s width $W_{108B}$ can be a lateral separation between points $M_1$ and $N_1$. Cross-sectional plane F can also cross cross-sectional line V-V to intersect points $N_2$ and $M_3$ on fin structure $108B_2$'s side surface and fin structure $108B_3$'s side surface that are proximate to fin structure $108B_1$. Separation $d_{B1}$ between fin structure $108B_1$ and fin structure $108B_2$ can be a lateral separation between points $M_1$ and $N_2$. Separation $d_{B2}$ between fin structure $108A_1$ and fin structure $108A_3$ can be a lateral separation between points $M_3$ and $N_1$. In some embodiments, plane F can be vertically between substrate 106's top surface 105 and top surface 109A, or between substrate 106's top surface 105 and top surface 109B. In some embodiments, plane F can be substantially coplanar with top surface 109A and/or 109B, where width $W_{108A}$ and width $W_{108B}$ can respectively represent fin structure 108A's top width and fin structure 108B's top width. In some embodiments, plane F can be substantially coplanar with top surface 105, where width $W_{108A}$ and width $W_{108B}$ can respectively represent fin structure 108A's top width and fin structure 108B's bottom width. In some embodiments, plane F can be vertically between top surface 139 and top surface 109A/109B, where width $W_{108A}$ and width $W_{108B}$ can respectively represent fin structure 108A's middle width and fin structure 108B's middle width.

In some embodiments, at least one of fin structure 108B's width $W_{108B}$ can be less than at least one of fin structure 108A's width $W_{108A}$. For example, width $W_{108B}$ of fin structure $108_{B1}$ (e.g., one of fin structures 108B) can be less than width $W_{108A}$ of fin structure $108_{B1}$ (e.g., one of fin structures 108A). In some embodiments, a difference between width $W_{108B}$ of fin structure $108_{B1}$ (e.g., one of fin structures 108B) and width $W_{108A}$ of fin structure $108_{B1}$ (e.g., one of fin structures 108A) can be from about 0.3 nm to about 2.5 nm, from about 0.4 nm to about 2.0 nm, or from about 0.5 nm to about 1.5 nm, which can be associated with oxide interfacial layer 608A's thickness $t_{608A}$ and oxide interfacial layer 608B's thickness $t_{608B}$ achieved by method 200 (discussed below). In some embodiments, a ratio of width $W_{108B}$ of fin structure $108_{B1}$ (e.g., one of fin structures 108B) to width $W_{108A}$ of fin structure $108_{B1}$ (e.g., one of fin structures 108A) can be from about 0.6 to about 0.95, from about 0.7 to about 0.95, or from about 0.8 to about 0.95, which can be associated with oxide interfacial layer 608A's thickness $t_{608A}$ and oxide interfacial layer 608B's thickness $t_{608B}$ achieved by method 200 (discussed below).

In some embodiments, each fin structure 108B's width $W_{108B}$ in area B can be less than each fin structure 108A's width $W_{108A}$ in area A. In some embodiments, an average of each fin structure 108B's width $W_{108B}$ in area B can be less than an average of each fin structure 108A's width $W_{108A}$ in area A. In some embodiments, a difference between an average of each fin structure 108B's width $W_{108B}$ in area B and an average of each fin structure 108A's width $W_{108A}$ in area A can be from about 0.3 nm to about 2.5 nm, from about 0.4 nm to about 2.0 nm, or from about 0.5 nm to about 1.5 nm, which can be associated with an average of oxide interfacial layer 608A's thickness $t_{608A}$ and oxide interfacial layer 608B's thickness $t_{608B}$ achieved by method 200 (discussed below). In some embodiments, a ratio of an average of each fin structure 108B's width $W_{108B}$ in area B to an average of each fin structure 108A's width $W_{108A}$ in area A can be from about 0.6 to about 0.95, from about 0.7 to about 0.95, or from about 0.8 to about 0.95, which can be associated with an average of oxide interfacial layer 608A's thickness $t_{608A}$ and oxide interfacial layer 608B's thickness $t_{608B}$ achieved by method 200 (discussed below).

In some embodiments, a median of each fin structure 108B's width $W_{108B}$ in area B can be less than a median of each fin structure 108A's width $W_{108A}$ in area A. In some embodiments, a difference between a median of each fin structure 108B's width $W_{108B}$ in area B and a median of each fin structure 108A's width $W_{108A}$ in area A can be from about 0.3 nm to about 2.5 nm, from about 0.4 nm to about 2.0 nm, or from about 0.5 nm to about 1.5 nm, which can be associated with a median of oxide interfacial layer 608A's thickness $t_{608A}$ and oxide interfacial layer 608B's thickness $t_{608B}$ achieved by method 200 (discussed below). In some embodiments, a ratio of a median each fin structure 108B's width $W_{108B}$ in area B to a median of each fin structure 108A's width $W_{108A}$ in area A can be from about 0.6 to about 0.95, from about 0.7 to about 0.95, or from about 0.8 to about 0.95, which can be associated with an average of oxide interfacial layer 608A's thickness $t_{608A}$ and oxide interfacial layer 608B's thickness $t_{608B}$ achieved by method 200 (discussed below).

Each fin structure 108A can have a height $H_{108A}$ between its top surface 109A and STI region 138's top surface 139.

Similarly, each fin structures 108B can have a height $H_{108B}$ between its top surface 109B and STI region 138's top surface 139. In some embodiments, each of fin structures 108A can have a substantially equal height $H_{108A}$ between each other. In some embodiments, each of fin structures 108B can have a substantially equal height $H_{108B}$ between each other. In some embodiments, height $H_{108A}$ can be substantially equal to height $H_{108B}$. In some embodiments, height $H_{108A}$ and/or height $H_{108B}$ can be from 40 nm to about 65 nm. Based on the disclosure herein, other dimensions for height $H_{108A}$ and/or height $H_{108B}$ are within the scope of this disclosure.

Substrate 106 can be a semiconductor material, such as silicon. In some embodiments, substrate 106 can include a crystalline silicon substrate (e.g., wafer). In some embodiments, substrate 106 can include (i) an elementary semiconductor, such as silicon (Si) and germanium (Ge); (ii) a compound semiconductor including silicon carbide (SiC), gallium arsenide (GaAs), gallium phosphide (GaP), indium phosphide (InP), indium arsenide (InAs), or indium antimonide (InSb); (iii) an alloy semiconductor including silicon germanium carbide (SiGeC), silicon germanium (SiGe), gallium arsenic phosphide (GaAsP), gallium indium phosphide (InGaP), gallium indium arsenide (InGaAs), gallium indium arsenic phosphide (InGaAsP), aluminum indium arsenide (InAlAs), or aluminum gallium arsenide (AlGaAs); or (iv) a combination thereof. Further, substrate 106 can be doped depending on design requirements (e.g., p-type substrate or n-type substrate). In some embodiments, substrate 106 can be doped with p-type dopants (e.g., boron (B), indium (In), aluminum (Al), or gallium (Ga)) or n-type dopants (e.g., phosphorus (P) or arsenic (As)).

Each of fin structures 108A and 108B can include a fin base 118 and a channel layer 122 formed over fin base 118. Each of fin base 118 and channel layer 122 can include a semiconductor material. For example, each of fin base 118 and channel layer 122 can include a semiconductor material having a lattice constant substantially close to (e.g., lattice mismatch within 5%) that of substrate 106. In some embodiments, fin base 118 and/or channel layer 122 can include a semiconductor material identical to substrate 106. In some embodiments, channel layer 122 can include silicon germanium (SiGe) with Ge in a range from about 0 atomic percent to about 40 atomic percent with any remaining atomic percent being Si. In some embodiments, channel layer 122 can include stack of semiconductor layers. For example, channel layer 122 can include first and second semiconductor layers (not shown in FIGS. 1A-1E) stacked in an alternating configuration. In some embodiments, the first and second semiconductor layers of channel layer 122 can include semiconductor materials with oxidation rates and/or etch selectivity different from each other. In some embodiments, each of the first and the second semiconductor layers can include silicon germanium (SiGe) with Ge in a range from about 0 atomic percent to about 40 atomic percent with any remaining atomic percent being Si. In some embodiments, each of fin base 118 and channel layer 122 can be undoped, doped with p-type dopants (e.g., B, In, Al, or Ga), or doped with n-type dopants (e.g., P or As). In some embodiments, fin base 118 and channel layer 122 can have respective vertical dimensions $H_{118}$ and $H_{122}$ (e.g., heights) along a z-axis, each ranging from about 20 nm to about 60 nm. Vertical dimensions $H_{118}$ and $H_{122}$ can be substantially equal to or different from each other and can have values such that the sum of $H_{118}$ and $H_{122}$ can range from about 80 nm to about 120 nm. Based on the disclosure herein, other dimensions and materials for fin base 118 and channel layer 122 are within the scope and spirit of this disclosure.

STI region 138 can provide electrical isolation between two proximate fin structures 108A and/or fin structures 108B. In some embodiments, STI regions 138 can include one or more layers of insulating material, such as a nitride layer, an oxide layer, a silicon oxide layer, a silicon nitride layer, a silicon oxynitride layer, a fluorine-doped silicate glass (FSG) layer, and a dielectric material layer. In some embodiments, STI region 138 can include a liner stack (not shown in FIGS. 1A-1E) and an insulating layer (not shown in FIGS. 1A-1E) formed on the liner stack. The liner stack can include an oxide or nitride material to determine oxidation of fin structures 108A's side surface 111A and/or fin structures 108B's side surface 111B during the formation of the insulating layer on the liner stack. In some embodiments, the insulating layer disposed on the liner stack can include silicon oxide, silicon nitride, silicon oxynitride, FSG, or a dielectric material. In some embodiments, the liner stack can have a thickness ranging from about 1 nm to about 5 nm. In some embodiments, STI region 138 can have a vertical dimension $H_{138}$ (e.g., height) along a z-axis ranging from about 40 nm to about 60 nm. Based on the disclosure herein, other dimensions and materials for STI region 138 are within the scope and spirit of this disclosure.

Referring to FIG. 1D, in some embodiments, one or more of fin structures 108B can further include shoulder structures 158 formed at opposite sides of each of the one or more fin structures 108B, where each fin structures 108A's side surface 111A can be a substantially straight or slanting sidewalls connecting top surface 109A and substrate 106. For example, as shown in FIG. 1D, fin structure 108B$_1$'s side surface 111B can include an upper side surface 113, a lower side surface 115, and shoulder structure 158 between upper side surface 113 and lower side surface 115. Fin structure 108B$_1$'s upper side surface 113 can be a substantially straight or slanting sidewall that can connect to fin structure 108B$_1$'s top surface 109B. Fin structure 108B$_1$'s lower side surface 115 can be a substantially straight or slanting sidewall that can connect to substrate 106's top surface 105. Lower side surface 115 can be vertically (e.g., in the z-direction) below fin structure 108B$_1$'s upper side surface 113. Lower side surface 115 can be laterally (e.g., in the y-direction) displaced from fin structure 108B$_1$'s upper side surface 113. Shoulder structure 158 with a lateral (e.g., in the y-direction) width $d_{158}$ can connect upper side surface 113 and lower side surface 115. In some embodiments, width $d_{158}$ can be from about 0.1 nm to about 1.0 nm or from about 0.2 nm to about 0.8 nm, which can be associated with oxide interfacial layer 608A's thickness $t_{608A}$ and oxide interfacial layer 608B's thickness $t_{608B}$ achieved by method 200 (discussed below). In some embodiments, shoulder structure 158 can be vertically positioned above STI region 138's top surface 139. In some embodiments, shoulder structure 158 can be substantially coplanar with STI region 138's top surface 139. In some embodiments, width $W_{108B}$ of an upper portion (e.g., above shoulder structure 158 and/or above STI region 138) of fin structures 108B can be less than width $W_{108A}$ of an upper portion (e.g., above STI region 138) of fin structures 108A, where width $W_{108B}$ of a lower portion (e.g., under shoulder structure 158 and/or buried in STI region 138) of fin structures 108B can be substantially equal to width $W_{108A}$ of a lower portion (e.g., buried in STI region 138) of fin structures 108A.

Referring to FIG. 1E, in some embodiments, one or more of fin structures 108A can further include shoulder structures 162 formed at opposite sides of each of the one or more fin structures 108A, where one or more of fin structures 108B can include shoulder structure 158. For example, as shown in FIG. 1E, fin structure $108A_1$'s side surface 111A can include an upper side surface 117, a lower side surface 119, and shoulder structure 162 between upper side surface 117 and lower side surface 119. Fin structure $108A_1$'s upper side surface 117 can be a substantially straight or slanting sidewall that can connect to fin structure $108A_1$'s top surface 109A. Fin structure $108A_1$'s lower side surface 119 can be a substantially straight or slanting sidewall that can connect to substrate 106's top surface 105. Lower side surface 119 can be vertically (e.g., in the z-direction) below fin structure $108A_1$'s upper side surface 117. Lower side surface 119 can be laterally (e.g., in the y-direction) displaced from fin structure $108A_1$'s upper side surface 117. Shoulder structure 162 with a lateral (e.g., in the y-direction) width $d_{162}$ can connect upper side surface 117 and lower side surface 119. In some embodiments, width $d_{162}$ can be less than or substantially equal to width $d_{158}$. In some embodiments, width $d_{162}$ can be from about 0.2 nm to about 0.8 nm, which is associated with oxide interfacial layer 608A's thickness $t_{608A}$ and oxide interfacial layer 608B's thickness $t_{608B}$ achieved by method 200 (discussed below). In some embodiments, shoulder structure 162 can be vertically positioned above STI region 138's top surface 139. In some embodiments, shoulder structure 162 can be substantially coplanar with STI region 138's top surface 139. In some embodiments, width $W_{108B}$ of an upper portion (e.g., above shoulder structure 158 and/or above STI region 138) of fin structures 108B can be less than width $W_{108A}$ of an upper portion (e.g., above shoulder structure 162 and/or above STI region 138) of fin structures 108A, where width $W_{108B}$ of a lower portion (e.g., under shoulder structure 158 and/or buried in STI region 138) of fin structures 108B can be substantially equal to width $W_{108A}$ of a lower portion (e.g., under shoulder structure 162 and/or buried in STI region 138) of fin structures 108A.

Figure 2:
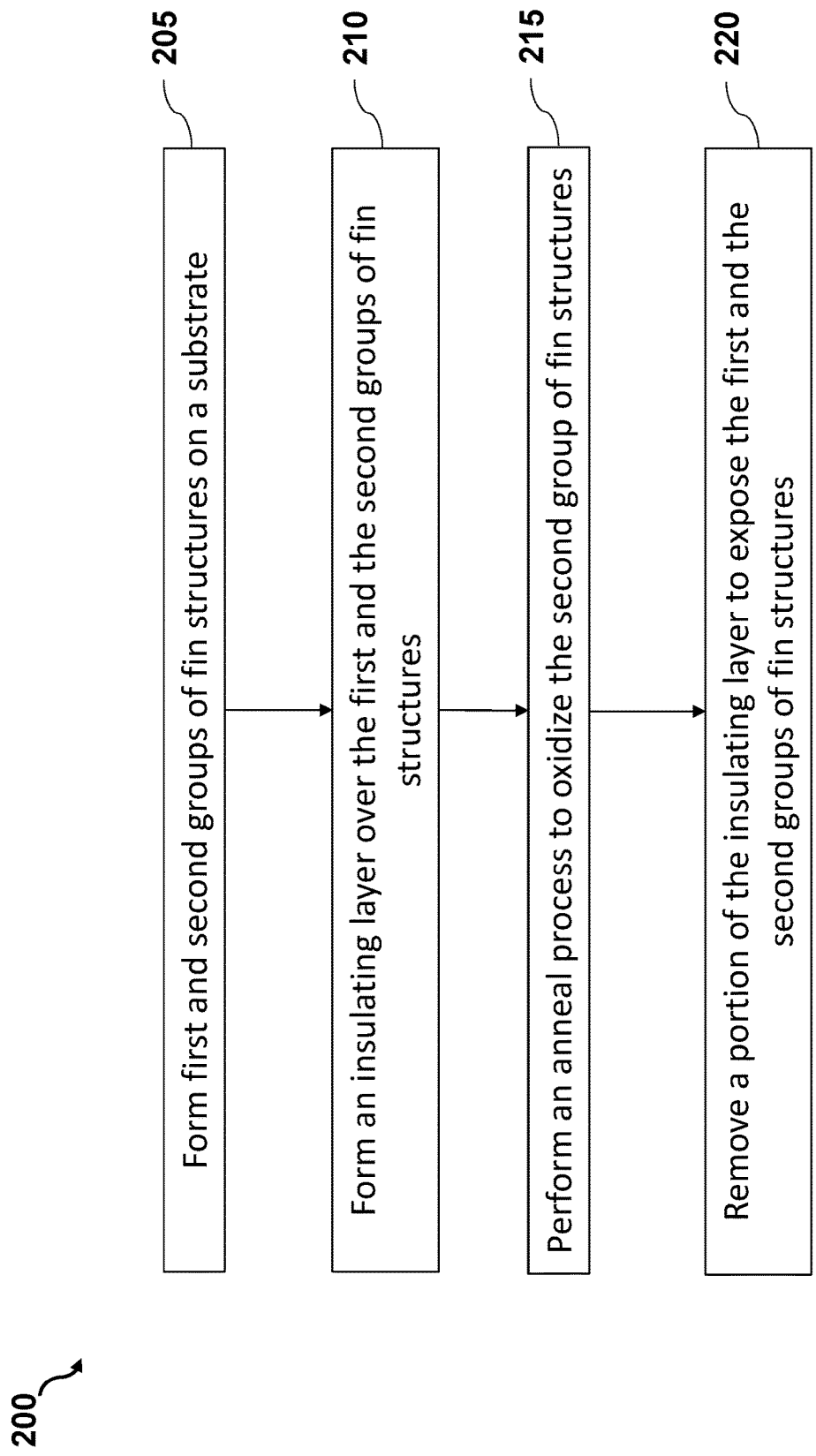
FIG. 2 is a flow diagram of a method for fabricating a semiconductor device, according to some embodiments.

FIG. 2 is a flow diagram of a method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3-9. Each of FIGS. 3-9 illustrates cross-sectional views along lines U-U and V-V of structure of FIG. 1B at various stages of its fabrication, according to some embodiments. Operations can be performed in a different order or not performed depending on specific applications. Method 200 may not produce a complete semiconductor device 100. Accordingly, it is understood that additional processes can be provided before, during, and/or after method 200, and that some other processes may only be briefly described herein. Further, the discussion of elements in FIGS. 1A-1E and 3-9 with the same annotations applies to each other, unless mentioned otherwise.

Referring to FIG. 2, in operation 205, first and second groups of fin structures are formed on a substrate. For example, as shown in FIG. 4, fin structures 108A (e.g., fin structures $108A_{1-3}$) and fin structures 108B (e.g., fin structures $108B_{1-3}$) can be formed on substrate 106, as described with reference to FIGS. 3 and 4. The process of forming fin structures 108A and fin structures 108B can include (i) providing substrate 106, (ii) patterning patterned mask layer 302 (e.g., patterned mask layers 302A and 302B shown in FIG. 3) over substrate 106, and (iii) removing the structure of FIG. 3 through patterned mask layer 302 (e.g., patterned mask layers 302A and 302B) to pattern fin structures 108A and fin structures 108B (e.g., fin structures $108A_{1-3}$ and fin structures $108B_{1-3}$ shown in FIG. 4).

In some embodiments, providing substrate 106 can further include epitaxially growing channel layer 122 over substrate 106. Channel layer 122 can be epitaxially grown by (i) a chemical vapor deposition (CVD) process, such as a low pressure CVD (LPCVD) process, an atomic layer CVD (ALCVD) process, an ultrahigh vacuum CVD (UHVCVD) process, and a reduced pressure CVD (RPCVD) process, (ii) an atomic layer deposition (ALD) process, or (iii) a molecular beam epitaxy (MBE) process. In some embodiments, the epitaxial growth of channel layer 122 can further include performing an in-situ doping process while epitaxially growing channel layer 122. In some embodiments, the in-situ doping process for doping channel layer 122 can include introducing p-type doping precursors (e.g., diborane ($B_2H_6$) or boron trifluoride ($BF_3$)), or n-type doping precursors (e.g., phosphine ($PH_3$) and arsine ($AsH_3$)) during the epitaxial growth of channel layer 122.

Figure 3:
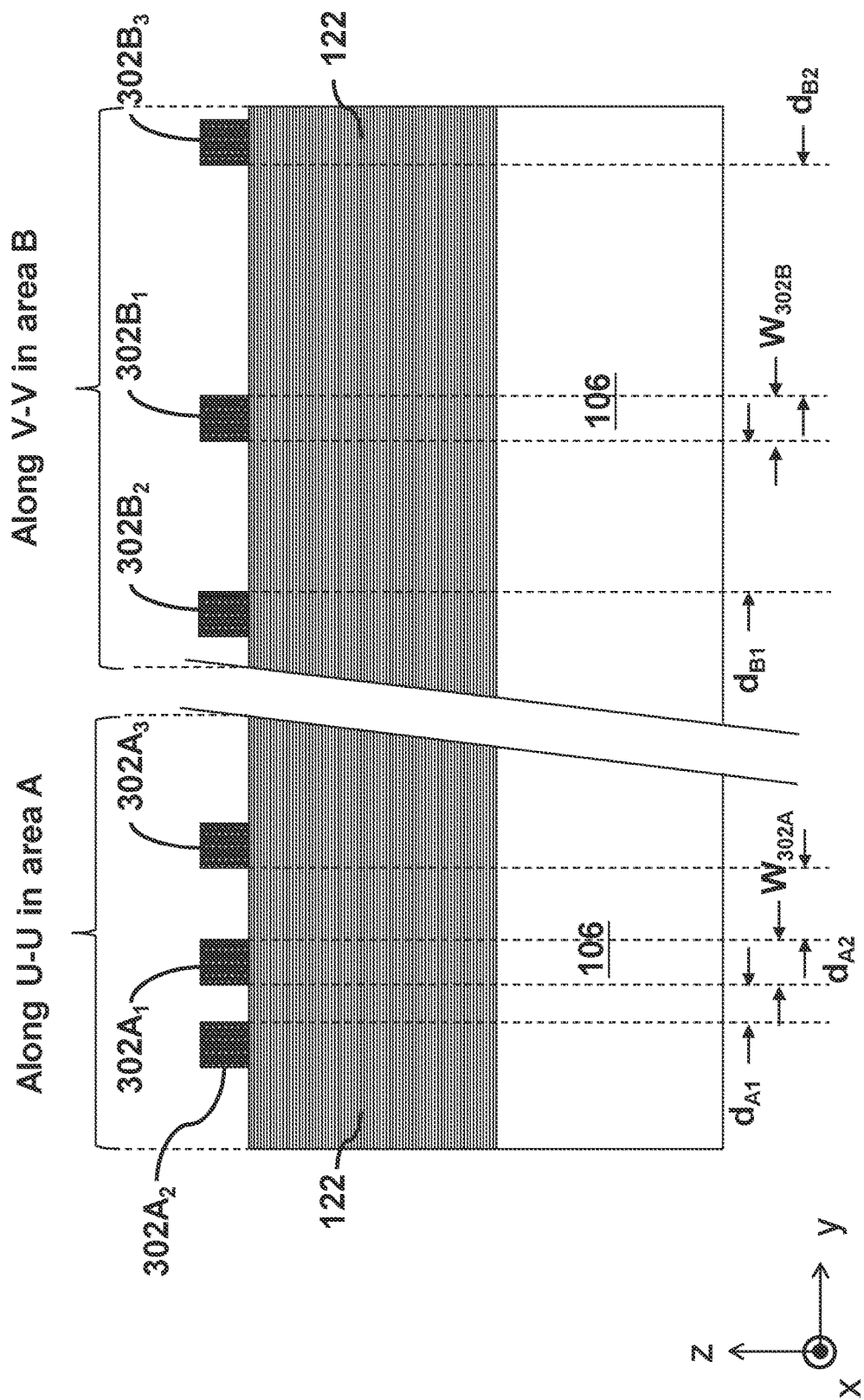
FIGS. 3-8 illustrate cross-sectional views of a semiconductor device at various stages of its fabrication process, according to some embodiments.
Figure 4:
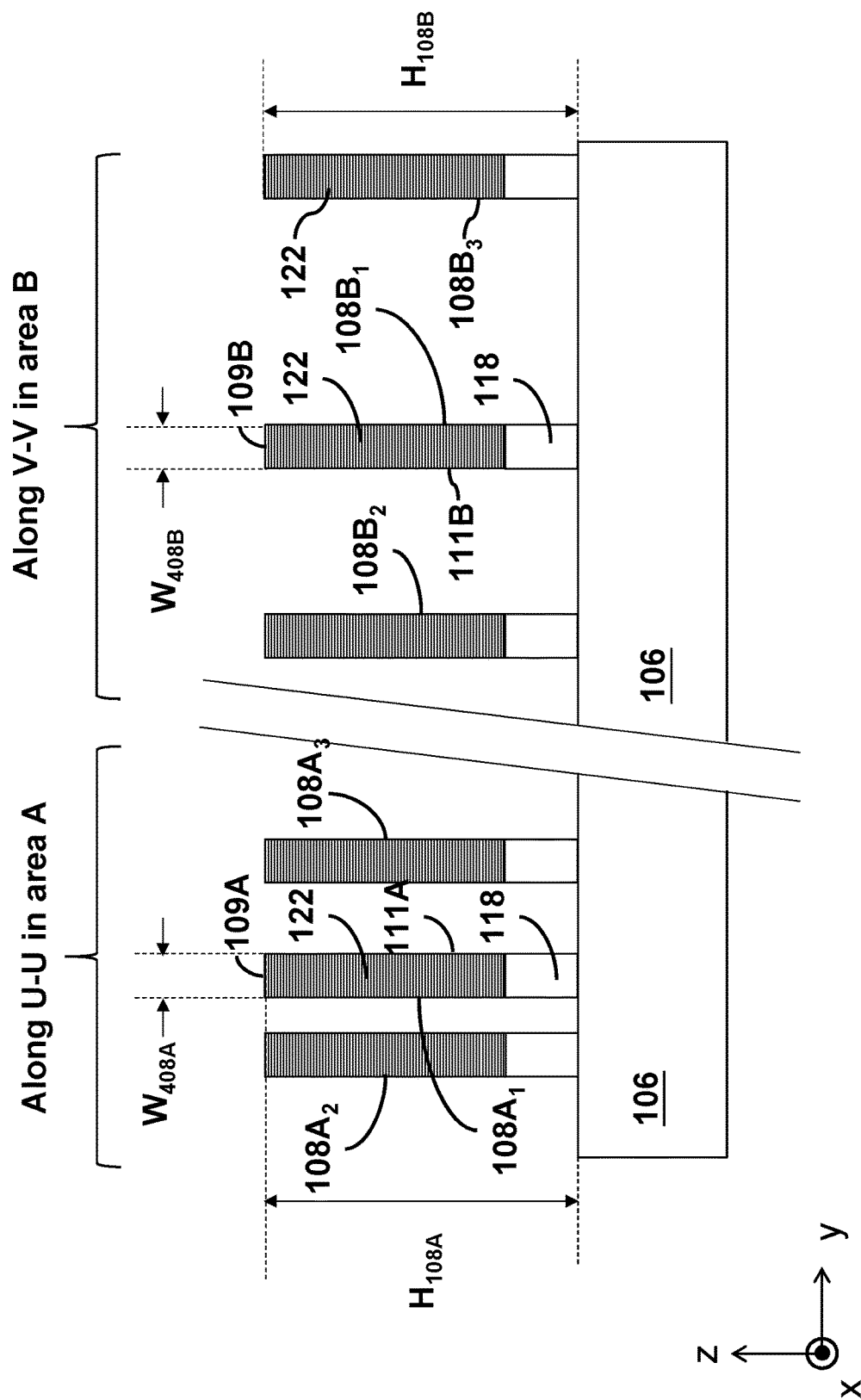

Referring to FIG. 3, the process of patterning mask layer 302 can include (i) depositing a blanket hardmask layer (not shown in FIG. 3) over substrate 106 or over channel layer 122, and (ii) patterning the blanket hardmask layer to form patterned mask layers 302A and 302B using a lithography process. In some embodiments, the blanket hardmask layer can be a silicon nitride layer deposited by a plasma enhanced CVD (PECVD) process or LPCVD process. The lithography process for patterning the blanket hardmask layer can include a deep ultraviolet (DUV) lithography process, an extreme ultraviolet (EUV) lithography process, a double-patterning lithography process, or a multi-patterning lithography process. As shown in FIG. 3, each of the resulting patterned mask layers 302A and 302B can respectively have a lateral (e.g., in the y-direction) width $W_{302A}$ and $W_{302B}$. In some embodiments, each of the resulting patterned mask layers 302A and 302B can have substantially equal lateral (e.g., in the y-direction) width with each other (e.g., width $W_{302A}$ can be substantially equal to width $W_{302B}$). In some embodiments, width $W_{302A}$ or $W_{302B}$ can be from about 10 nm to about 50 nm. Further, each of the resulting patterned hard mask layers 302A can be proximate to one another in area A with a lateral separation, such as separation $d_{A1}$ and separation $d_{A2}$. Similarly, each of the resulting patterned hard mask layers 302B can be proximate to one another in area B with a lateral separation, such as separation $d_{B1}$ and separation $d_{B2}$. In some embodiments, as discussed above, area A and B can respectively be referred as tight pitch area and sparse pitch area of semiconductor device 100. Accordingly, at least one the lateral (e.g., in the y-direction) separations between each of two proximate patterned mask layers 302A can be less than at least one of the lateral (e.g., in the y-direction) separations between each of two proximate patterned mask layers 302B. For example, at least one of separation $d_{A1}$ and separation $d_{A2}$ can be less than at least one of separation $d_{B1}$ and separation $d_{B2}$. In some embodiments, at least one of separation $d_{A1}$ and separation $d_{A2}$ can be from about 15 nm to about 40 nm, and at least one of separation $d_{B1}$ and separation $d_{B2}$ can be from about 100 nm to about 300 nm. In some embodiments, an average lateral (e.g., in the y-direction) separations between each of two proximate patterned mask layers 302A can be less than an average lateral (e.g., in the y-direction) separations between each of two proximate patterned mask layers 302B. For example, the average of lateral (e.g., in the y-direction) $d_{A1}$ and separation $d_{A2}$ can be from about 20 nm to about 70 nm, and the average of lateral (e.g., in the y-direction) $d_{B1}$ and separation $d_{B2}$ can be from about 70 nm to about 250 nm. In some embodiments, a ratio of the average of lateral (e.g., in the y-direction) separation between each of two proximate patterned mask layers 302B to the average of lateral (e.g., in the y-direction) separation between each of two proximate patterned mask layers 302A can be from about 1 to about 15. Based on the disclosure herein, other dimensions for widths $W_{302A}$ and $W_{302B}$ and separations $d_{A1}$, $d_{A2}$, $d_{B1}$, and $d_{B2}$ are within the scope and spirit of this disclosure.

In some embodiments, a median of lateral (e.g., in the y-direction) separations between patterned mask layers 302A can be less than a median of lateral (e.g., in the y-direction) separations between patterned mask layers 302B. For example, the median of lateral (e.g., in the y-direction) $d_{A1}$ and separation $d_{A2}$ can be from about 25 nm to about 70 nm, and the median of lateral (e.g., in the y-direction) $d_{B1}$ and separation $d_{B2}$ can be from about 70 nm to about 250 nm. In some embodiments, a ratio of the average of lateral (e.g., in the y-direction) separation between patterned mask layers 302B to the average of lateral (e.g., in the y-direction) separation between patterned mask layers 302A can be from about 1 to about 15.

The process of patterning fin structures 108A and 108B can include etching substrate 106 and/or channel layers 122 through patterned mask layer 302 (e.g., patterned mask layers 302A and 302B) using a dry etch, a wet etch process, or a combination thereof. In some embodiments, the dry etch process can include using etchants having an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable etching gases and/or plasmas, or combinations thereof. The wet etch process can include etching in diluted hydrofluoric acid (DHF), potassium hydroxide (KOH) solution, ammonia, a solution containing hydrofluoric acid (HF), nitric acid ($HNO_3$), acetic acid ($CH_3COOH$), or combinations thereof. As shown in FIG. 4, each of the resulting fin structures 108A (e.g., fin structures $108A_{1-3}$) can have top surface 109A and side surface 111A. Similarly, each of the resulting fin structures 108B (e.g., fin structures $108B_{1-3}$) can have top surface 109B and side surface 111B. As discussed above, side surfaces 111A and 111B can be substantially perpendicular to slanting to substrate 106. For simple illustration purpose, side surfaces 111A and 111B described in method 200 are illustrated as sidewalls substantially perpendicular to substrate 106 in FIGS. 4-9. Each of the resulting fin structures 108A (e.g., fin structures $108A_{1-3}$) and fin structures 108B (e.g., fin structures $108B_{1-3}$) can respectively have a vertical (e.g., in the z-direction) height $H_{108A}$ and $H_{108B}$. Further, each of the resulting fin structures 108A (e.g., fin structures $108A_{1-3}$) and fin structures 108B (e.g., fin structures $108B_{1-3}$) can respectively have a lateral (e.g., in the y-direction) width $W_{408A}$ and $W_{408B}$. In some embodiments, width $W_{408A}$ can be substantially equal to or less than pattern mask layer 302A's width $W_{302A}$ due to an undercut introduced by the dry etching process. In some embodiments, width $W_{408B}$ can be substantially equal to and less than pattern mask layer 302B's width $W_{302B}$ due to an undercut introduced by the dry etching process. In some embodiments, at least one of fin structure 108A's width $W_{408A}$ can be less than at least one of fin structure 108B's width $W_{408B}$ (e.g., $W_{408A}$ can be less than $W_{408B}$) due to a loading effect during the dry etch process that patterns fin structures 108A and 108B. For example, during the dry etching process, the plasma density associated with the dry etching process can be determined by a local pattern density on substrate 106 (e.g., fin's density on substrate 106, or pattern mask layers 302's density on substrate 106). In some embodiments, the plasma density proximate to area A can be greater than that proximate to area B. Accordingly, the dry etching process can result in greater lateral (e.g., in the y-direction) undercut associated with fin structures 108A than that associated with fin structures 108B. In some embodiments, a ratio of the fin structures 108A's lateral (e.g., in the y-direction) undercut associated with the dry etching process to the fin structures 108B's lateral (e.g., in the y-direction) undercut associated with the dry etching process can be greater than 1.05, greater than 1.1, greater than 1.3, greater than 1.5, or greater than 2.0. If the above-noted ratio is below the above-noted lower limits, method 200 may not form insulating layer 538 with area-dependent thickness (discussed below) to define widths of fin structures 108A and fin structures 108B as discussed in FIGS. 1A-1E. In some embodiments, due to the dry etching process's plasma density proximate to area A being greater than that proximate to area B, the dry etching process can etch substrate 106 and/or channel layers 122 through patterned mask layer 302 with a first etching rate at area A (e.g., for patterning fin structures $108A_{1-3}$) and a second etching rate at area B (e.g., for patterning fin structures $108B_{1-3}$), where the first etching rate can be greater than the second etching rate. In some embodiments, a ratio of the first etching rate to the second etching rate can be greater than 1.05, greater than 1.1, greater than 1.3, greater than 1.5, or greater than 2.0. If the above-noted ratio is below the above-noted lower limits, method 200 may not form insulating layer 538 with area-dependent thickness (discussed below) to define widths of fin structures 108A and fin structures 108B as discussed in FIGS. 1A-1E. In some embodiments, due to the previously described loading effect associated with the dry etch process, fin structure 108A's width $W_{408A}$ can be less than fin structure 108B's width $W_{408B}$. For example, a difference between one of fin structures 108A's width $W_{408A}$ and one of fin structures 108B's width $W_{408B}$ can be from about 0.5 nm to about 20 nm, from about 1 nm to about 20 nm, from about 2 nm to about 20 nm, from about 5 nm to about 20 nm, or from about 8 nm to about 15 nm, where width $W_{302A}$ can be substantially equal to width $W_{302B}$. If the above-noted difference is below the above-noted lower limits, method 200 may not form insulating layer 538 with area-dependent thickness (discussed below) to define widths of fin structures 108A and fin structures 108B as discussed in FIGS. 1A-1E. If the above-noted difference is beyond the above-noted upper limits, the resulting fin structures 108B and/or fin structures 108A may introduce short channel effects for semiconductor device 100. In some embodiments, due to the previously described loading effect associated with the dry etch process, an average of fin structures 108A's width $W_{408A}$ can be less than an average of fin structures 108B's width $W_{408B}$. For example, a difference between an average of fin structures 108A's width $W_{408A}$ and an average fin structures 108B's width $W_{408B}$ can be from about 0.5 nm to about 20 nm, from about 1 nm to about 20 nm, from about 2 nm to about 20 nm, from about 5 nm to about 20 nm, or from about 9 nm to about 16 nm, where width $W_{302A}$ can be substantially equal to width $W_{302B}$. If the above-noted difference is below the above-noted lower limits, method 200 may not form insulating layer 538 with area-dependent thickness (discussed below) to define widths of fin structures 108A and fin structures 108B as discussed in FIGS. 1A-1E. If the above-noted difference is beyond the above-noted upper limits, the resulting fin structures 108B and/or fin structures 108A may introduce short channel effects for semiconductor device 100. In some embodiments, due to the previously described loading effect associated with the dry etch process, a ratio of an average of fin structures 108A's width $W_{408A}$ to an average fin structures 108B's width $W_{408B}$ can be less than about 0.99, less than about 0.95, less than about 0.9, less than about 0.8, or less than about 0.7, where width $W_{302A}$ can be substantially equal to width $W_{302B}$. If the above-noted ratio is beyond the above-noted upper limits, method 200 may not form insulating layer 538 with area-dependent thickness (discussed below) to define widths of fin structures 108A and fin structures 108B as discussed in FIGS. 1A-1E. In some embodiments, due to the previously described loading effect associated with the dry etch process, a median of fin structures 108A's width $W_{408A}$ can be less than a median of fin structures 108B's width $W_{408B}$. For example, a difference between a median of fin structures 108A's width $W_{408A}$ and a median of fin structures 108B's width $W_{408B}$ can be from about 0.5 nm to about 20 nm, from about 1 nm to about 20 nm, from about 2 nm to about 20 nm, from about 5 nm to about 20 nm, or from about 8 nm to about 15 nm, where width $W_{302A}$ can be substantially equal to width $W_{302B}$. If the above-noted difference is below the above-noted lower limits, method 200 may not form insulating layer 538 with area-dependent thickness (discussed below) to define widths of fin structures 108A and fin structures 108B as discussed in FIGS. 1A-1E. If the above-noted difference is beyond the above-noted upper limits, the resulting fin structures 108B and/or fin structures 108A may introduce short channel effects for semiconductor device 100. In some embodiments, due to the previously described loading effect associated with the dry etch process, a ratio of a median of fin structures 108A's width $W_{408A}$ to a median fin structures 108B's width $W_{408B}$ can be less than about 0.99, less than about 0.95, less than about 0.9, less than about 0.8, or less than about 0.7, where width $W_{302A}$ can be substantially equal to width $W_{302B}$. If the above-noted ratio is beyond the above-noted upper limits, method 200 may not form insulating layer 538 with area-dependent thickness (discussed below) to define widths of fin structures 108A and fin structures 108B as discussed in FIGS. 1A-1E.

Figure 5:
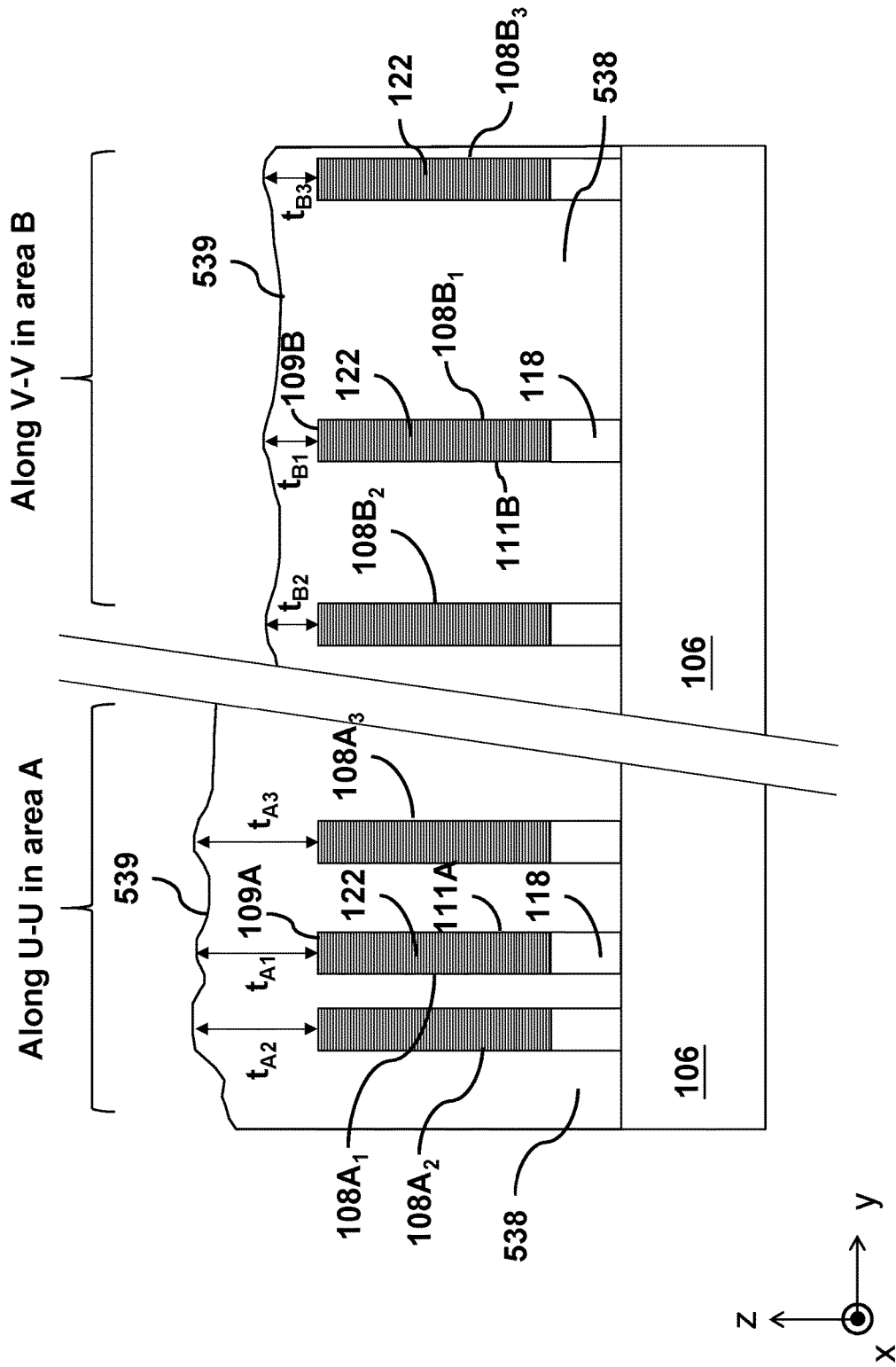

Referring to FIG. 2, in operation 210, an insulating layer is formed over the first and second groups of fin structures. For example, an insulating layer 538 can be formed over fin structures 108A and 108B, as described with reference to FIG. 5. The process of forming insulating layer 538 can include depositing one or more insulating materials over fin structures 108A and 108B. The one or more insulating materials for insulating layer 538 can include silicon oxide, silicon nitride, silicon oxynitride, fluoride-doped silicate glass (FSG), or a low-k dielectric material. The one or more insulating materials for insulating layer 538 can be deposited using an ALD process, a CVD process, a high-density-plasma (HDP) CVD process, or a flowable CVD (FCVD) process. As shown in FIG. 5, the resulting insulating layer 538 can be formed over fin structure 108A's side surface 111A and fin structures 108B's side surface 111B. In some embodiments, insulating layer 538 can be formed over fin structure 108A's top surface 109A and fin structures 108B's top surface 109B. For example, insulating layer 538's top surface 539 can be vertically (e.g., in the z-direction) above fin structures 108A's top surface 109A and fin structures 108B's top surface 109B. In some embodiments, each fin structures 108A can be buried deeper in insulating layer 538 than each fin structures 108B, due to a loading effect during a deposition process for insulating layer 538. For example, during the deposition process, a precursor gas's density associated with the deposition process can be determined by a local pattern density on substrate 106 (e.g., fin structure 108A's and/or 108B's density on substrate 106). Therefore, the precursor gas's density proximate to area A can be greater than that proximate to area B. Accordingly, the deposition process can result in a thicker insulating layer 538 over fin structures 108A than over fin structures 108B. For example, insulating layer 538's top surface 539 can be above each of fin structure $108A_1$'s top surface 109, fin structure $108A_2$'s top surface 109, and fin structure $108A_3$'s top surface 109 by a thickness $t_{A1}$, thickness $t_{A2}$, and thickness $t_{A3}$, respectively. Further, insulating layer 538's top surface 539 can be above each of fin structure $108B_1$'s top surface 109, fin structure $108B_2$'s top surface 109, and fin structure $108B_3$'s top surface 109 by a thickness $t_{B1}$, thickness $t_{B2}$, and thickness $t_{B3}$, respectively. Accordingly, at least one of thickness $t_{A1}$, thickness $t_{A2}$ and thickness $t_{A3}$ can be greater than at least one of thickness $t_{B1}$, thickness $t_{B2}$ and thickness $t_{B3}$. In some embodiments, at least one of thickness $t_{A1}$, thickness $t_{A2}$ and thickness $t_{A3}$ can be greater than at least one of thickness $t_{B1}$, thickness $t_{B2}$ and thickness $t_{B3}$ by about 50 nm to about 250 nm, about 50 nm to about 200 nm, or about 150 nm to about 250 nm, due to the previously described loading effect associated with the deposition process. If the above-noted difference is below the above-noted lower limits, method 200 may not form oxide layers 608A and 608B with sufficient thickness difference (discussed below) to define widths of fin structures 108A and fin structures 108B as discussed in FIGS. 1A-1E. If the above-noted difference is beyond the above-noted upper limits, method 200 may not be able to form oxide layers 608A and 608B to define widths of fin structures 108A and fin structures 108B as discussed in FIGS. 1A-1E. In some embodiments, an average thickness between insulating layer 538's top surface 539 and fin structures 108A's top surface 109 (e.g., the average of thickness $t_{A1}$, thickness $t_{A2}$, and thickness $t_{A3}$) can be greater than an average thickness between insulating layer 538's top surface 539 and fin structures 108B's top surface 109 (e.g., the average of thickness $t_{B1}$, thickness $t_{B2}$, and thickness $t_{B3}$) by about 50 nm to about 250 nm, about 50 nm to about 200 nm, or about 90 nm to about 140 nm, due to the previously described loading effect. If the above-noted average thicknesses' difference is below the above-noted lower limits, method 200 may not form oxide layers 608A and 608B with sufficient thickness difference (discussed below) to define widths of fin structures 108A and fin structures 108B as discussed in FIGS. 1A-1E. If the above-noted thicknesses' difference is beyond the above-noted upper limits, method 200 may not be able to form oxide layers 608A and 608B to define widths of fin structures 108A and fin structures 108B as discussed in FIGS. 1A-1E. In some embodiments, a ratio of an average thickness between insulating layer 538's top surface 539 and fin structures 108A's top surface 109 (e.g., the average of thickness $t_{A1}$, thickness $t_{A2}$, and thickness $t_{A3}$) to an average thickness between insulating layer 538's top surface 539 and fin structures 108B's top surface 109 (e.g., the average of thickness $t_{B1}$, thickness $t_{B2}$, and thickness $t_{B3}$) can be greater than about 1.05, greater than about 1.1, greater than about 1.5, greater than about 2.0, greater than about 3.0, or greater than about 5.0, due to the previously described loading effect associated with the deposition process. If the above-noted ratio is below the above-noted lower limits, method 200 may not form oxide layers 608A and 608B with sufficient thickness difference (discussed below) to define widths of fin structures 108A and fin structures 108B as discussed in FIGS. 1A-1E. In some embodiments, a median of thickness between insulating layer 538's top surface 539 and fin structures 108A's top surface 109 (e.g., the median of thickness $t_{A1}$, thickness $t_{A2}$, and thickness $t_{A3}$) can be greater than a median of thickness between insulating layer 538's top surface 539 and fin structures 108B's top surface 109 (e.g., the median of thickness $t_{B1}$, thickness $t_{B2}$, and thickness $t_{B3}$) by about 50 nm to about 250 nm, about 50 nm to about 200 nm, or about 120 nm to about 180 nm, due to the previously describe loading effect. If the above-noted median thicknesses' difference is below the above-noted lower limits, method 200 may not form oxide layers 608A and 608B with sufficient thickness difference (discussed below) to define widths of fin structures 108A and fin structures 108B as discussed in FIGS. 1A-1E. If the above-noted median thicknesses' difference is beyond the above-noted upper limits, method 200 may not be able to form oxide layers 608A and 608B to define widths of fin structures 108A and fin structures 108B as discussed in FIGS. 1A-1E. In some embodiments, the deposition process for depositing insulating layer 538 can have a first deposition rate at area A (e.g., depositing over fin structures $108A_{1-3}$) and a second deposition rate at area B (e.g., depositing over fin structures $108B_{1-3}$) where the first deposition rate can be greater than the second deposition rate. In some embodiments, a ratio of the first deposition rate to the second deposition rate can be greater than about 1.05, greater than 1.1, greater than 1.3, greater than 1.5, or greater than 2.0. If the above-noted ratio is below the above-noted lower limits, method 200 may not form oxide layers 608A and 608B with sufficient thickness difference (discussed below) to define widths of fin structures 108A and fin structures 108B as discussed in FIGS. 1A-1E. In some embodiments, each of fin structures 108A can be buried in insulating layer 538, and one or more of fin structures 108B can protrude above insulating layer 538 (this embodiment is not shown in FIG. 5). For example, each of fin structures 108A's top surface 109 can be vertically (e.g., in the z-direction) below insulating layer 538's top surface 539, and one or more of fin structures 108B's top surface 109 can be vertically (e.g., in the z-direction) above insulating layer 538's top surface 539.

Figure 6:
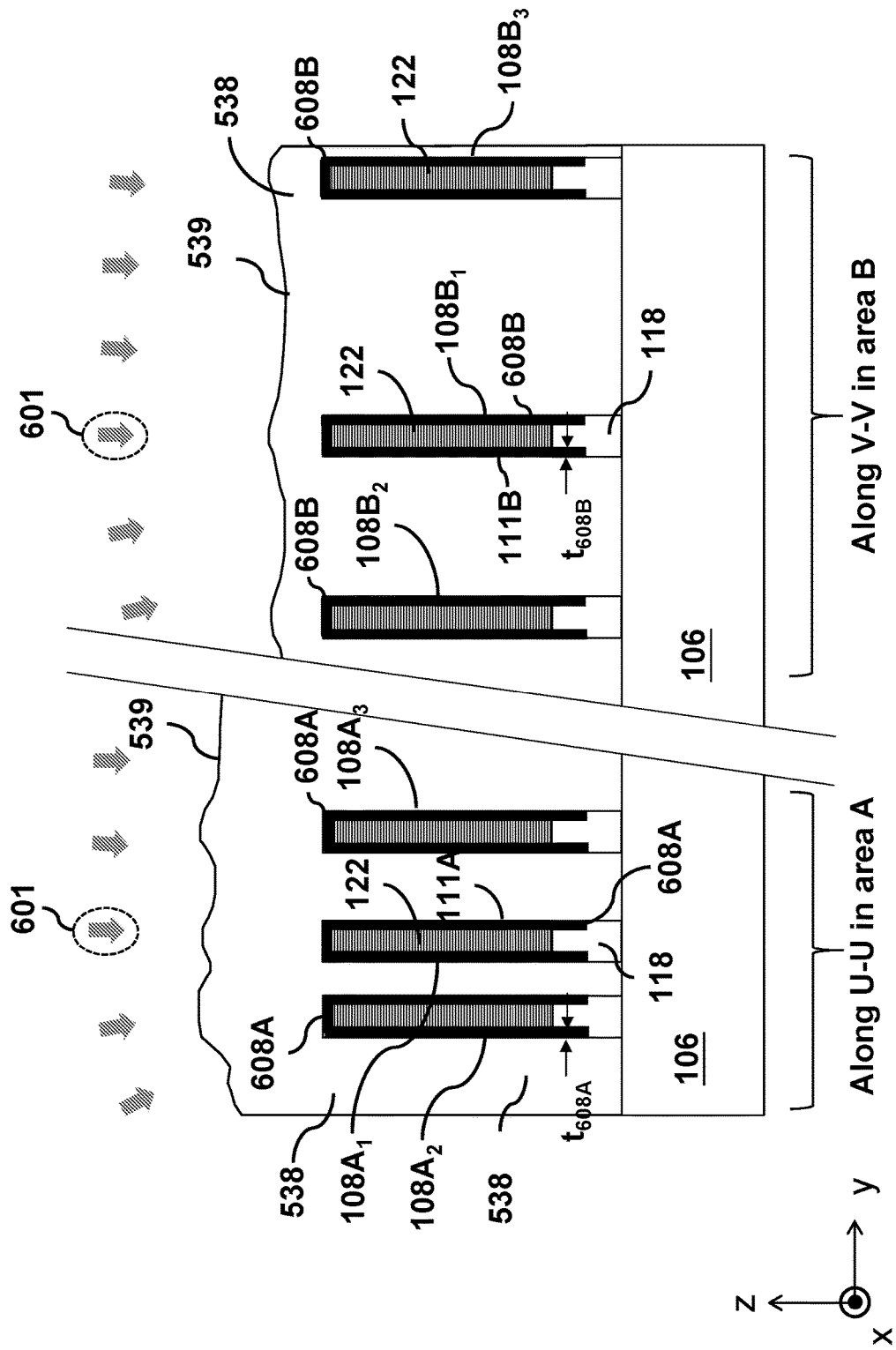
Figure 7:
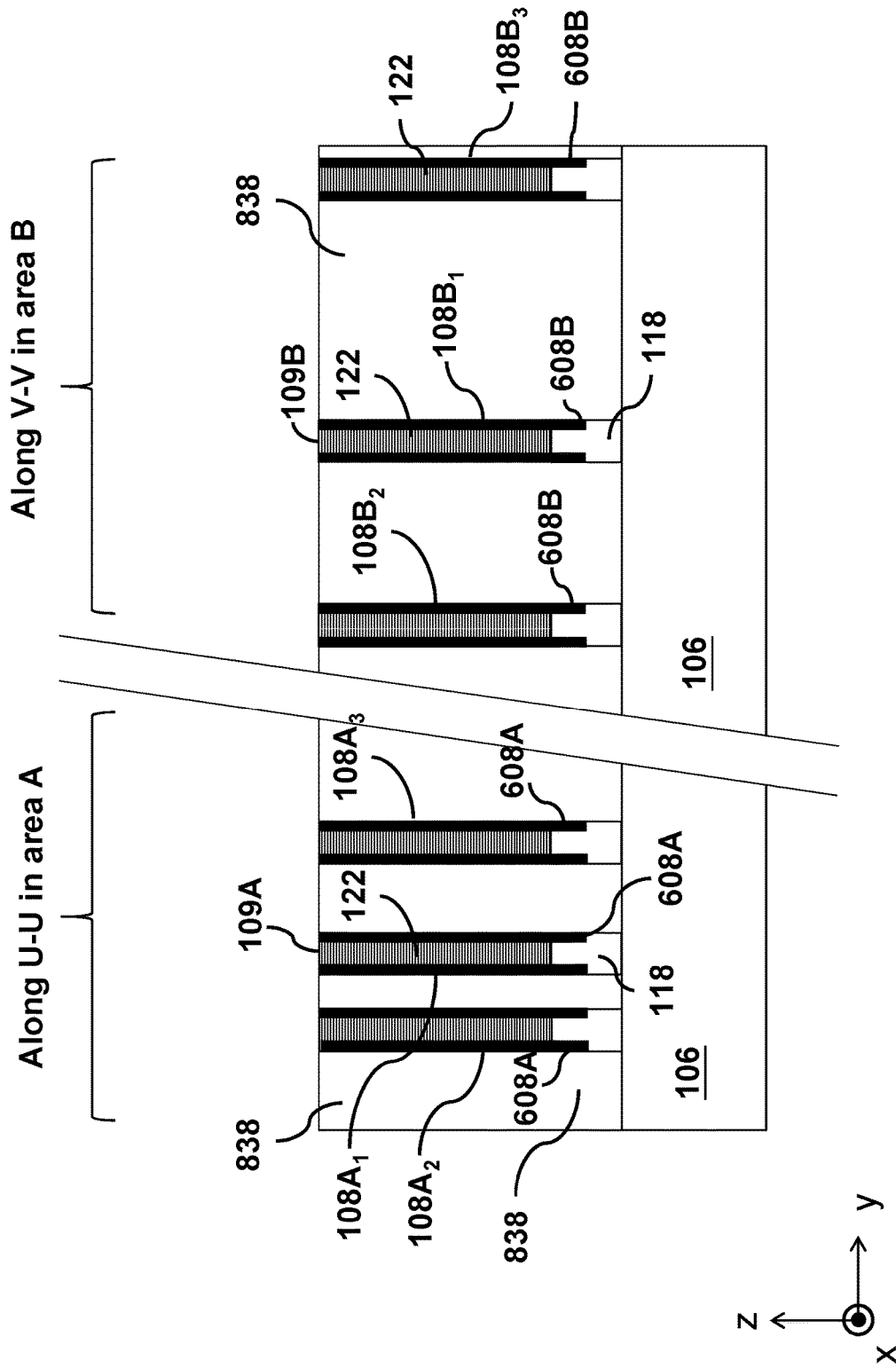

Referring to FIG. 2, in operation 215, an annealing process is performed to oxidize the second group of fin structures. For example, the annealing process can oxidize portions of fin structures 108B to form an oxide layer 608B over fin structures 108B's surface 111B under a gas flow 601, as described with reference to FIG. 6. The annealing process can include annealing the structure of FIG. 5 under a gas flow 601. In some embodiments, gas flow 601 can include an oxygen gas flow and/or a steam ($H_2O$) flow. In some embodiments, the annealing process can be performed at a temperature ranging from about 200° C. to about 700° C. for a period in a range from about 30 min to about 120 min. Based on the temperature and/or the annealing time associated with the annealing process, portions of gas flow 601 can diffuse through insulating layer 538 to reach an upper portion of fin structures 108B, thus oxidizing the upper portion of fin structures 108B's surface to form oxide layer 608B (e.g., oxide layer 608B can partially cover fin structures 108B's side surface 111B, as shown in FIG. 6). In some embodiments, gas flow 601 can diffuse through insulating layer 538 to oxidizing the entire fin structures 108B's surface, thus forming oxide layer 608B connecting fin structures 108B's top surface 109B and substrate 106 (e.g., oxide layer 608B can substantially cover the entire of fin structures 108B's side surface 111B; this embodiment is not shown in FIG. 6). On the other hand, the resulting oxide layer 608B can block the supply of gas flow 601 to react with fin structures 108B. This can limit the growth of oxide layer 608B, thus resulting an upper bound of oxide layer 608B's final thickness $t_{608B}$ (e.g., self-limiting oxidation). In some embodiments, due to the above-noted self-limitation oxidation, oxide layer 608B's thickness $t_{608B}$ can be from about 0.4 nm to about 2.5 nm, from about 0.5 nm to about 2.0 nm, or from about 0.5 nm to about 1.5 nm. If the thickness $t_{608B}$ is below the above-noted lower limits, method 200 may not thin fin structure 108B from width $W_{408B}$ to $W_{108B}$ (discussed below) as discussed in FIGS. 1A-1E. If thickness $t_{608B}$ is beyond the above-noted upper limits, operation 215 may require higher annealing temperature and/or longer annealing time that can damage fin structures 108's structural integrity.

Similarly, based on the temperature and/or the annealing time associated with the annealing process, gas flow 601 can also diffuse through insulating layer 538 to reach an upper portion of fin structures 108A, thus oxidizing the upper portion of fin structures 108A's surface to form oxide layer 608A (e.g., oxide layer 608A can partially cover fin structures 108A's side surface 111A, as shown in FIG. 6). In some embodiments, gas flow 601 can diffuse through insulating layer 538 to oxidizing the entire fin structures 108A's surface, thus forming oxide layer 608A connecting fin structures 108A's top surface 109A and substrate 106 (e.g., oxide layer 608A can substantially cover the entire of fin structures 108A's side surface 111A; this embodiment is not shown in FIG. 6). In some embodiments, as previously discussed in operation 210, fin structures 108A can be buried deeper in insulating layer 538 than fin structures 108B. Accordingly, during the annealing process, an amount of gas flow 601 that can reach fin structures 108A can be less than an amount of gas flow 601 that can reach fin structures 108B. Therefore, the annealing process can form oxide layer 608A with a thickness $t_{608A}$ over fin structures 108A less than oxide layer 608B's thickness $t_{608B}$. For example, since fin structures 108A can be buried deeper in insulating layer 538 than fin structures 108B, a ratio of oxide layer 608A's thickness $t_{608A}$ to oxide layer 608B's thickness $t_{608B}$ can be less than about 0.95, less than about 0.9, less than about 0.7, less than about 0.5, less than about 0.3, or less than about 0.1. If the above-noted ratio is beyond the above-noted upper limits, oxide layers 608A and 608B may not have sufficient thickness difference to define widths of fin structures 108A and fin structures 108B as discussed in FIGS. 1A-1E. In some embodiments, oxide layer 608A's thickness $t_{608A}$ can be substantially equal to 0 nm (e.g., fin structures 108A can be substantially not oxidized by the annealing process). In some embodiments, due to the above-noted self-limitation oxidation, oxide layer 608A's thickness $t_{608A}$ can be less than about 0.1 nm, less than about 0.2 nm, less than about 0.3 nm, or less than about 0.5 nm. If the above-noted thickness $t_{608A}$ is beyond the above-noted upper limits, operation 215 may require higher annealing temperature and/or longer annealing time that can damage fin structures 108's structural integrity. In some embodiments, the annealing process can be performed with an annealing time from about 30 minutes to about 120 minutes, from about 30 minutes to about 90 minutes, from about 30 minutes to about 60 minutes, or from about 30 minutes to about 45 minutes. If the annealing time is above-noted upper limits, gas flow 601 will have enough time to penetrate through insulating layer 538 to form oxide layer 608A's thickness $t_{608A}$ substantially equal to oxide layer 608A's thickness $t_{608B}$. If the annealing time is below the above-noted upper limits, gas flow 601 may not reach fin structure 108B to form oxide layer 608B. In some embodiments, the annealing process for forming oxide layers 608A and 608B can oxidize fin structures $108A_{1-3}$ and $108B_{1-3}$ respectively at first and second oxidization rates, where the first oxidation rate can be less than the second oxidation rate. In some embodiments, a ratio of the first oxidation rate to the second oxidation rate can be less than about 0.95, less than about 0.9, less than about 0.7, less than about 0.5, less than about 0.3, or less than about 0.1. If the above-noted ratio is beyond the above-noted upper limits, oxide layers 608A and 608B may not have sufficient thickness difference to define widths of fin structures 108A and fin structures 108B as discussed in FIGS. 1A-1E. In some embodiments, the first oxidation rate can be substantially equal to zero and the second oxidation rate can be greater than zero, where the annealing process can be performed at a temperature from about 200° C. to about 700° C., from about 200° C. to about 600° C., from about 200° C. to about 500° C., from about 200° C. to about 400° C., or from about 200° C. to about 300° C. If the temperature is above-noted upper limits, the first oxidation rate can be greater than zero. If the temperature is below noted upper limits, the second oxidation rate can be substantially equal to zero.

Figure 8:
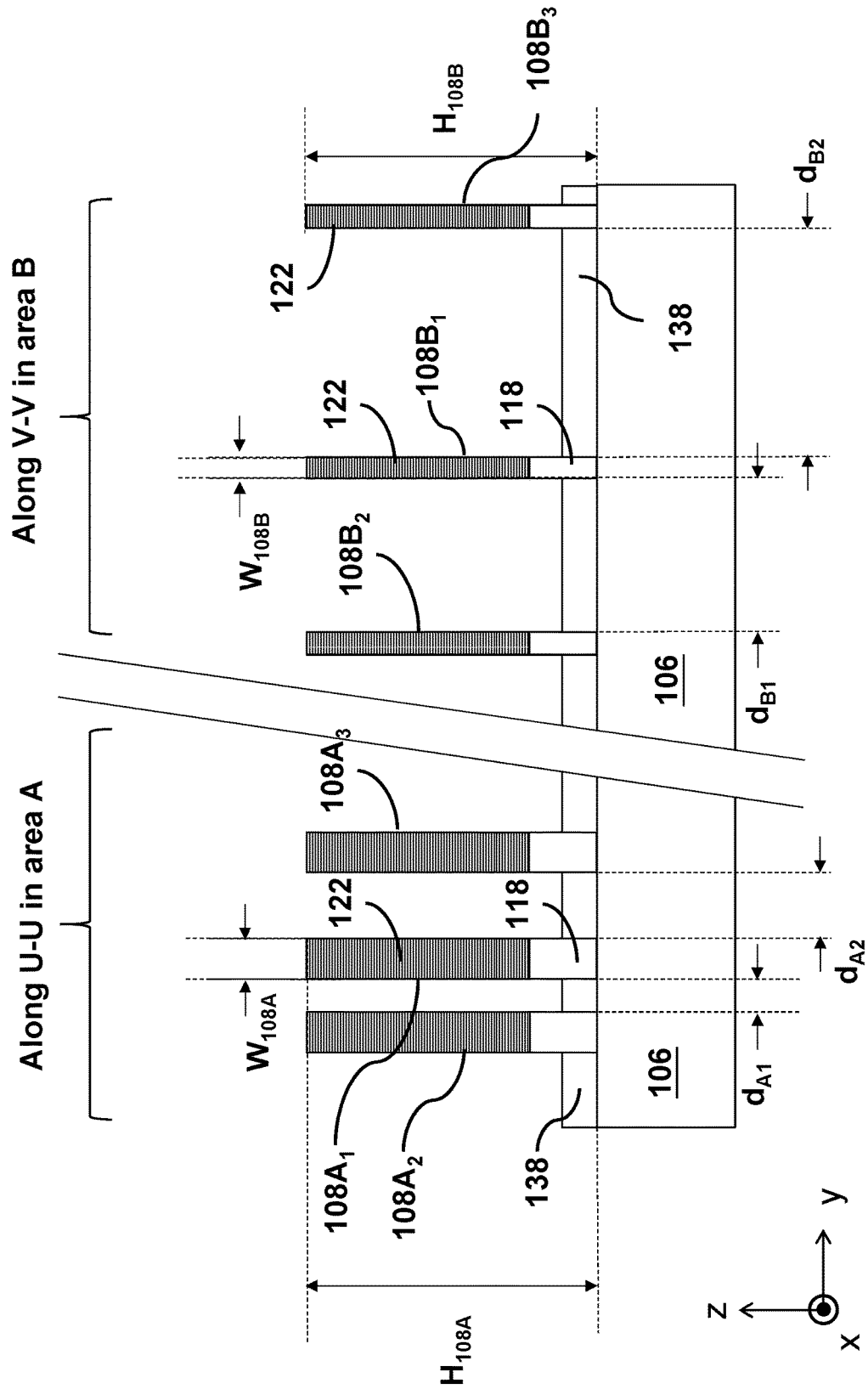

Referring to FIG. 2, in operation 220, a portion of the insulating layer is removed to expose the first and second groups of fin structures. For example, as shown in FIG. 8, a portion of insulating layer 538 can be removed to form STI region 138 that can expose fin structures 108A and fin structures 108B, as described with reference to FIGS. 7 and 8. The process of forming STI region 138 can include polishing insulating layer 538 of the structures of FIG. 6 using a chemical mechanical polishing (CMP) to form insulating layer 838 (shown in FIG. 7). In some embodiments, insulating layer 838 can be substantially coplanar with fin structures 108A's top surface 109A and/or fin structure 108B's top surface 109B. The process of forming STI region 138 can further include removing portions of insulating layer 838 to form STI region 138 (shown in FIG. 8) with a dry etch and/or a wet etch process, where fin structures 108A and 108B can protrude through STI region 138. For example, the dry etch process and/or the wet etch process can remove oxide layer 608A and oxide layer 608B to respectively expose fin structures 108A and 108B, while removing portions of insulating layer 838. Accordingly, fin structures 108A can be thinned from width $W_{408A}$ (shown in FIG. 4) to width $W_{108A}$ (shown in FIG. 8) after removing the portions of insulating layer 838. Each of fin structures 108A can be separated from each other with separation $d_{A1}$ and a separation $d_{A2}$ after forming STI region 138. Similarly, fin structures 108B can be thinned from width $W_{408B}$ (shown in FIG. 4) to width $W_{108B}$ (shown in FIG. 8) after removing the portions of insulating layer 838. Each of fin structures 108B can be separated from each other with separation $d_{B1}$ and a separation $d_{B2}$ after forming STI region 138. In some embodiments, after removing the portions of insulating layer 838, fin structures 108B' width $W_{108B}$ can be less than fin structures 108A's width $W_{108A}$. It is because prior to the removing of the portions of insulating layer 838, oxide layer 608B's thickness $t_{608B}$ (shown in FIG. 6) can be greater than oxide layer 608A's thickness $t_{608A}$ (shown in FIG. 6) as previously discussed. In some embodiments, after removing the portions of insulating layer 838, width $W_{108B}$ of an upper portion (e.g., above STI region 138) of fin structures 108B can be less than width $W_{108A}$ of an upper portion (e.g., above STI region 138) of fin structures 108A, where width $W_{108B}$ of a lower portion (e.g., buried in STI region 138) of fin structures 108B can also be less than width $W_{108A}$ of a lower portion (e.g., buried in STI region 138) of fin structures 108A. One of the reasons, among others, for the above-noted embodiment is because oxide layers 608A and 608B formed at operation 215 can substantially cover the entire of fin structures 108A's side surface 111A and the entire of fin structures 108B's side surface 111B. Hence, the remaining oxide layers 608A and 608B at lower portions of fin structures 108A and 108B can be included in STI region 138 after operation 220. In some embodiments, after removing the portions of insulating layer 838, width $W_{108B}$ of an upper portion (e.g., above STI region 138) of fin structures 108B can be less than width $W_{108A}$ of an upper portion (e.g., above STI region 138) of fin structures 108A, where width $W_{108B}$ of a lower portion (e.g., buried in STI region 138) of fin structures 108B can be substantially equal to width $W_{108A}$ of a lower portion (e.g., buried in STI region 138) of fin structures 108A. One of the reasons, among others, for the above-noted embodiment is because oxide layers 608A and 608B formed at operation 215 can partially cover the upper portion of fin structures 108A's side surface 111A and the upper portion of fin structures 108B's side surface 111B. In some embodiments, after removing the portions of insulating layer 838, fin structures 108B' height $H_{108B}$ can be substantially equal to fin structures 108A's height $H_{108A}$. The dry etch process for removing the portions of insulating layer 838 can include using a plasma dry etch with a gas mixture having octafluorocyclobutane ($C_4F_8$), argon (Ar), oxygen ($O_2$), and helium (He), fluoroform ($CHF_3$) and He, carbon tetrafluoride ($CF_4$), difluoromethane ($CH_2F_2$), chlorine ($Cl_2$), hydrogen bromide (HBr), or a combination thereof with a pressure ranging from about 1 mTorr to about 5 mTorr. The wet etch process for removing the portions of insulating layer 838 can include using a diluted hydrofluoric acid (DHF) treatment, an ammonium peroxide mixture (APM), a sulfuric peroxide mixture (SPM), hot deionized water (DI water), or a combination thereof.

Figure 9:
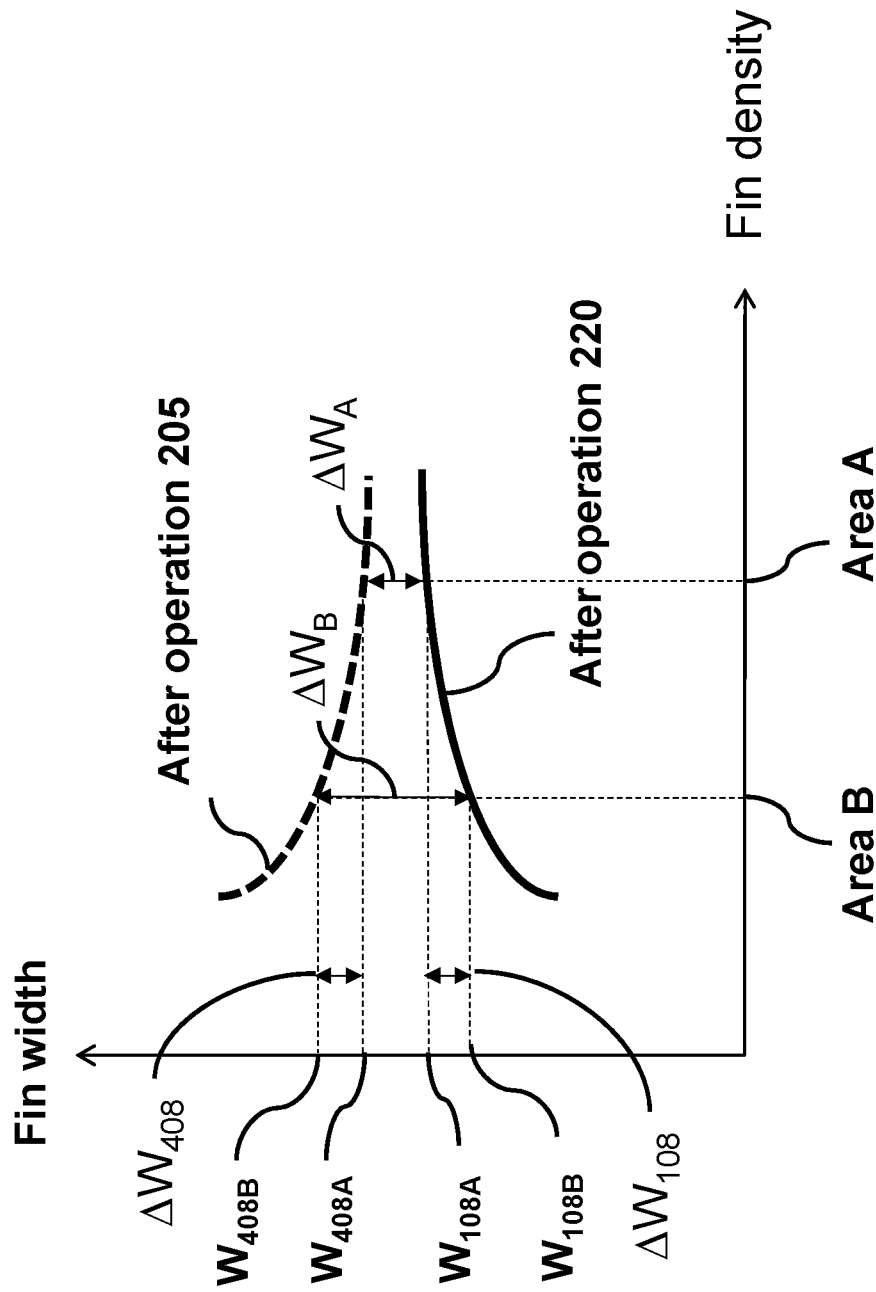
FIG. 9 illustrates a distribution of fin width associated with density of fins in a semiconductor device at various stages of its fabrication process, according to some embodiments.

Referring to FIG. 9, after operation 220, fin structures 108 with various lateral dimension can be formed over various regions of substrate 106 as described with references to FIG. 9, according to some embodiments. The x-axis of FIG. 9 represents density of fin patterns formed on substrate 106, such as the average or median of fin structure 108's lateral (e.g. in the y-direction) separation as previously discussed. The y-axis of FIG. 9 represents fin structure 108's lateral (e.g., in the y-direction) width, such as the average or median of fin structure 108's lateral (e.g. in the y-direction) width. For example, FIG. 9 illustrates exemplary fin structures 108A's width $W_{408A}$ formed after operation 205 (e.g., the formation step for fin structures) and width $W_{108A}$ formed after operation 220 (e.g., the formation step for STI region 138). FIG. 9 further illustrates exemplary fin structures 108B's width $W_{408B}$ formed after operation 205 (e.g., the formation step for fin structures 108B) and width $W_{108B}$ formed after operation 220 (e.g., the formation step for STI region 138). In some embodiments, as previously discussed, fin structures 108A formed at area A can have higher fin pattern density than fin structures 108B formed at area B. As shown in FIG. 9, method 200 can thin fin structures 108A from an original formed lateral (e.g., in the y-direction) width $W_{408A}$ by a width reduction $\Delta W_A$ to a final lateral (e.g., in the y-direction) width $W_{108A}$. Similarly, method 200 can thin fin structures 108B from an original formed lateral (e.g., in the y-direction) width $W_{408B}$ by a width reduction $\Delta W_B$ to a final lateral (e.g., in the y-direction) width $W_{108B}$. In some embodiments, fin structures 108B can be thinner than fin structures 108A after method 200. For example, width reduction $\Delta W_B$ can be greater than width reduction $\Delta W_A$, after operation 220. In some embodiments, width reduction $\Delta W_B$ can be greater than width reduction $\Delta W_A$ by about 0.5 nm to about 10 nm, about 0.5 nm to about 5 nm, about 0.8 nm to about 3 nm, or about 0.8 nm to about 2 nm. If width reduction $\Delta W_B$ is below the above-noted lower limits, fin structures 108B may introduce short channel effects for semiconductor device 100. If width reduction $\Delta W_B$ is beyond the above-noted upper limits, fin structures 108B may not maintain their structural integrity (e.g., bending or collapse). In some embodiments, a ratio of width reduction $\Delta W_B$ to width reduction $\Delta W_A$ can be from about 1.1 to about 5.0, from about 1.1 to about 3.0, or from about 1.5 to about 3.0. If the above-noted ratio is below the above-noted lower limits, fin structures 108B may introduce short channel effects for semiconductor device 100. If the above-noted ratio is beyond the above-noted upper limits, fin structures 108B may not maintain their structural integrity (e.g., bending or collapse). As previously discussed, a width difference $\Delta W_{408}$ (e.g., an absolute difference between $W_{408A}$ and $W_{408B}$) between fin structures 108A and 108B can be greater than or substantially equal to 0 nm during an etching process of operation 205. Because the plasma density associated with the etching process of operation 205 can be greater proximate to area A than proximate to area B), the etching process of operation 205 can result in greater lateral undercut for fin structures 108A than that for fin structures 108B. In some embodiments, a width difference $\Delta W_{108}$ (e.g., an absolute difference between $W_{108A}$ and $W_{108B}$) between fin structures 108A and 108B can be determined by the previously discussed fin pattern density's loading-effect during the deposition of insulating layer 538 of operation 210 and the oxidation process of operation 215. In some embodiments, fin structures 108's lateral (e.g., in the y-direction) width's variation after operation 220 can be less than that defined by operation 205, because the annealing process of operation 215 and the etching process of operation 220 can cause greater width reduction for fin structures 108B defined by operation 205. For example, width difference $\Delta W_{108}$ after operation 220 can be less than width difference $\Delta W_{408}$ after operation 205. In some embodiments, a ratio of width difference $\Delta W_{108}$ to width difference $\Delta W_{408}$ can be less than about 0.9, less than about 0.7, less than about 0.5, or less than about 0.3 because the annealing process of operation 215 and the etching process of operation 220 can cause greater width reduction for fin structures 108B defined by operation 205. Further, if above-noted ratio is beyond the above-noted upper limits, the reliability and yield of semiconductor device 100 may degrade.

Following operating 220, a transistor structure (e.g., fin-FETs or GAA FETs) can be formed over fin structures 108A and 108B. In some embodiments, a process of forming the transistor structure can include a forming sacrificial gate structures traversing (e.g., in the y-direction) through fin structures 108A and 108B, forming source/drain regions proximate the sacrificial gate structures and over fin structures 108A and 108B, and replacing the sacrificial gate structure with the metal-gate structures. The process of forming the transistor structure can further include forming an interconnect structure over the metal-gate structures and the source/drain regions to provide electrical routing between the transistor structures formed over fin structures 108A and 108B. Based on the disclosure herein, other formation methods for forming the transistor structure in semiconductor device 100 are within the spirit and scope of this disclosure.

The present disclosures provides an exemplary fin structure and a method for forming the same. The fin structure can have a lateral dimension (e.g., width) associated with an average or a median of separations between the fin structure and the fin structure's proximate fin structures. In some embodiments, a group of tight-pitch vertical structures and a group of sparse-pitch vertical structures can be formed over a substrate. An average separation between two proximate tight-pitch vertical structures can be less than an average separation between two proximate sparse-pitch vertical structures. In some embodiments, each of the sparse-pitch vertical structures can have a greater width than each of the tight-pitch vertical structures. In some embodiments, each of the tight-pitch vertical structure's width can be less than a threshold to provide a robust short channel control, and each of the sparse-pitch vertical structure width can be greater than the threshold and therefore can be adversely subject to short channel effects. In some embodiments, an annealing process and an etch process can be performed to respectively thin the sparse-pitch vertical structures and the tight-pitch vertical structures to sparse-pitch fin structures and tight-pitch fin structures. In some embodiments, each of the sparse-pitch fin structures can have a smaller width than each of the tight-pitch fin structures. Accordingly, each of the tight-pitch fin structures' width and the sparse-pitch fin structures' width can be less than the threshold to provide robust short channel control. A benefit of the fin structures, among others, is to mitigate fin structures' width variation associated with fin structures' pattern density, thus enhancing fin structures' short channel control to boost the transistor's performance.

In some embodiments, a method for forming a semiconductor structure can include forming a first fin structure and a second fin structure over a substrate, depositing an insulating layer over top surfaces of the first and the second fin structures at first and second deposition rates, respectively, and removing a portion of the insulating layer to expose the top surfaces of the first and the second fin structures. A first width of the first fin structure can be less than a second width of the second fin structure. The first deposition rate can be greater than the second deposition rate. Removing the portion of the insulating layer can include decreasing the first width of the first fin structure to a third width, and decreasing the second width of the second fin structure to a fourth width less than the third width In some embodiments, a method for forming a semiconductor structure can include forming first fin structures and second fin structures over a substrate, forming an insulating layer over top surfaces of the first and second fin structures, and removing the insulating layer to expose the top surfaces of the first and second fin structures. A separation between each of the first fin structures can be less than an other separation between each of the second fin structures. Removing the insulating layer can include thinning the first fin structures to a first width and thinning the second fin structures to a second width less than the first width.

In some embodiments, a semiconductor structure can include a substrate, a first group of fin structures formed over the substrate and having first separations between adjacent fin structures in the first group of fin structures, and a second plurality of fin structures formed over the substrate and having second separations between adjacent fin structures in the second group of fin structures. An average of the first separations of the first group of fin structures can be less than an average of the second separations of the second group of fin structures. An average of top widths of the first group of fin structures can be greater than an average of top widths of the second group of fin structures.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
forming a first fin structure and a second fin structure over a substrate, wherein a first width of the first fin structure is less than a second width of the second fin structure;
depositing an insulating layer over a top surface of the first fin structure at a first deposition rate and over a top surface of the second fin structure at a second deposition rate, wherein the first deposition rate is greater than the second deposition rate; and
removing a portion of the insulating layer to expose the top surfaces of the first and second fin structures, wherein removing the portion of the insulating layer comprises decreasing the first width of the first fin structure to a third width, and decreasing the second width of the second fin structure to a fourth width less than the third width.

2. The method of claim 1, wherein forming the first and second fin structures comprises:
forming a first hardmask layer and a second hardmask layer over the substrate, wherein the first and second hardmask layers have a substantially equal width; and
removing the substrate exposed outside the first and second hardmask layers to expose sidewalls of the first and second fin structures.

3. The method of claim 2, wherein forming the first and second hardmask layers comprises:
forming a third hardmask layer proximate to the first hardmask layer; and
forming a fourth hardmask layer proximate to the second hardmask layer, wherein a first separation between the first hardmask layer and the third hardmask layer is less than a second separation between the second hardmask layer and the fourth hardmask layer.

4. The method of claim 1, wherein forming the first and second fin structures comprises:
growing an epitaxial layer over the substrate;
forming a hardmask layer over the epitaxial layer; and
removing the epitaxial layer exposed outside the hardmask layer.

5. The method of claim 1, wherein a ratio of the first deposition rate to the second deposition rate is greater than about 1.1.

6. The method of claim 1, further comprising annealing the insulating layer to form an interfacial layer over side surfaces of the first and second fin structures, wherein a first thickness of the interfacial layer over the first fin structure is less than a second thickness of the interfacial layer over the second fin structure.

7. The method of claim 6, wherein removing the portion of the insulating layer comprises removing the interfacial layer to decrease the second width of the second fin structure.

8. The method of claim 6, wherein removing the portion of the insulating layer comprises polishing the annealed insulating layer to planarize a top surface of the annealed insulating layer.

9. A method for forming a semiconductor structure, comprising:
forming first fin structures and second fin structures over a substrate;
forming an insulating layer over top surfaces of the first fin structures and top surfaces of the second fin structures, wherein a first thickness between a top surface of the insulating layer and the top surfaces of the first fin structures is greater than a second thickness between the top surface of the insulating layer and the top surfaces of the second fin structures; and
removing the insulating layer to expose the top surfaces of the first and second fin structures, wherein removing the insulating layer comprises thinning the first fin structures to a first width and thinning the second fin structures to a second width less than the first width.

10. The method of claim 9, wherein forming the first and second fin structures comprises:
forming first hardmask layers and second hardmask layers with a substantially equal width; and
removing the substrate exposed outside the first and second hardmask layers to expose sidewalls of the first and second fin structures.

11. The method of claim 9, wherein forming the first and second fin structures comprises:
growing an epitaxial layer over the substrate;
forming a hardmask layer over the epitaxial layer; and
removing the epitaxial layer exposed outside the hardmask layer.

12. The method of claim 9, further comprising annealing the insulating layer to form a first interfacial layer over side surfaces of the first fin structures and a second interfacial layer over side surfaces of the second fin structures, wherein a first thickness of the first interfacial layer is less than a second thickness of the second interfacial layer.

13. The method of claim 12, wherein removing the insulating layer comprises removing the first and second interfacial layers to thin the first and second fin structures.

14. The method of claim 12, wherein removing the insulating layer comprises polishing the annealed insulating layer to planarize a top surface of the annealed insulating layer.

15. The method of claim 9, wherein forming the first and second fin structures comprises forming a first number of the first fin structures per unit area and forming a second number, less than the first number, of the second fin structures per unit area.

16. A method, comprising:
forming first fin structures and second fin structures over a substrate;
depositing an insulating layer over top surfaces of the first fin structures and top surfaces of the second fin structures, wherein a first thickness between a top surface of the insulating layer and the top surfaces of the first fin structures is greater than a second thickness between the top surface of the insulating layer and the top surfaces of the second fin structures;
annealing the insulating layer to form a first interfacial layer over the first fin structures and a second interfacial layer over the second fin structures, wherein a first thickness of the first interfacial layer is less than a second thickness of the second interfacial layer; and removing the insulating layer and the first and second interfacial layers to thin the first fin structures to a first width and to thin the second fin structures to a second width less than the first width.

17. The method of claim 16, wherein forming the first and second fin structures comprises forming a first separation between each of bottom portions of the first fin structures and forming a second separation, greater than the first separation, between each of bottom portions of the second fin structures.

18. The method of claim 16, wherein depositing the insulating layer comprises depositing the insulating layer over the top surfaces of the first fin structures at a first deposition rate and depositing the insulating layer over the top surfaces of the second fin structures at a second deposition rate less than the first deposition rate.

19. The method of claim 16, wherein annealing the insulating layer comprises oxidizing the first and second fin structures in an oxygen gas flow.

20. The method of claim 16, wherein annealing the insulating layer comprises oxidizing the first and second fin structures by a self-limiting oxidation process at a temperature ranging from about 200° C. to about 700° C. for a period ranging from about 30 min to about 120 min.

* * * * *